United States Patent [19]
Signell et al.

[11] Patent Number: 6,078,276
[45] Date of Patent: Jun. 20, 2000

[54] DIGITAL-TO-ANALOG CONVERSION OF LSB-FIRST TYPE USING SELECTIVE INVERSION BASED ON GRAY CODE BITS

[75] Inventors: Svante Signell, Vällingby; Nianxiong Tan, Sollentuna, both of Sweden

[73] Assignee: Telefonaktiebolaget LM Ericsson, Stockholm, Sweden

[21] Appl. No.: 08/990,940

[22] Filed: Dec. 15, 1997

[30] Foreign Application Priority Data

Dec. 16, 1996 [SE] Sweden ................................. 9604616
Dec. 16, 1996 [SE] Sweden ................................. 9604617
May 15, 1997 [SE] Sweden ................................. 9701812

[51] Int. Cl.[7] .............................. H03M 1/72; H03M 1/80
[52] U.S. Cl. ............................................ 341/146; 341/153
[58] Field of Search ...................... 341/146, 159, 341/136, 153; 332/103; 375/223; 327/362; 342/149; 345/98

[56] References Cited

U.S. PATENT DOCUMENTS

| | | | |
|---|---|---|---|
| 3,701,152 | 10/1972 | Howard | 342/149 |
| 4,591,826 | 5/1986 | Seiler. | |
| 4,596,979 | 6/1986 | Sisson | 341/136 |
| 5,180,932 | 1/1993 | Bengel | 327/362 |
| 5,424,740 | 6/1995 | Chang et al.. | |
| 5,519,396 | 5/1996 | Distinti | 341/153 |
| 5,798,747 | 8/1998 | Moraveji | 345/98 |
| 5,847,667 | 12/1998 | Baek | 341/101 |

FOREIGN PATENT DOCUMENTS 34 00 061  7/1985  Germany.
34 13 456  10/1985  Germany.

*Primary Examiner*—Howard L. Williams
*Assistant Examiner*—Patrick Wamsley
*Attorney, Agent, or Firm*—Burns, Doane, Swecker & Mathis, L.L.P.

[57] ABSTRACT

D/A-conversion of a Gray coded digital input signal is performed according to an inventive recursive Gray code-to-analog conversion algorithm. According to the recursive algorithm, the Gray code bits of the digital input are successively applied in the recursions of the algorithm, one Gray code bit for each recursion, and the analog output signal is generated by recursively updating an intermediate signal. In each recursion, the intermediate signal is selectively inverted in dependence on the particular Gray code bit that is applied in the recursion. The selective inversion of the intermediate signal is an inherent property of the Gray code-to-analog algorithm, and it is a key factor to reduce the accumulation of errors in a D/A-conversion. In a D/A-converter architecture based on the algorithm, the accumulation of offset errors will be low. Furthermore, the fact that the signal inversion is digitally controlled enables high precision implementations, further improving the performance of the D/A-converter.

21 Claims, 14 Drawing Sheets

6,078,276

DIGITAL-TO-ANALOG CONVERSION OF LSB-FIRST TYPE USING SELECTIVE INVERSION BASED ON GRAY CODE BITS

TECHNICAL FIELD

The present invention generally relates to digital-to-analog conversion, and more specifically to cyclic and pipeline digital-to-analog conversion.

BACKGROUND

A digital-to-analog (D/A) converter is a circuit on the borderline between the digital domain and the analog domain which acts as an intermediary in the exchange of information between the two domains. As the name indicates, a D/A-converter converts or transforms digital input signals to analog output signals, and is normally used for converting digital information in the form of combinations of two-level digits or bits into quantized analog information. D/A-converters are found in numerous applications of all modern technologies. They are widely used in different fields of electronics and communication.

The performance evaluation of a D/A-converter with regard to accuracy and distortion is normally based on the magnitude of the error generated in the D/A-conversion.

In general, all D/A-converters suffer from e.g. offset errors due to imperfections in the circuit realizations of the converters. These offset errors severely influence the behavior and performance of conventional D/A-converters.

In particular, in conventional cyclic D/A-converters and pipeline D/A-converters using regular binary code, the offset errors propagate and accumulate in a strictly increasing manner during a conversion, thus limiting the accuracy of the converter and increasing the distortion. In addition, relatively large differential and integral non-linearities are introduced.

SUMMARY

The present invention reduces these and other drawbacks of the prior art.

It is a general object of the present invention to provide a D/A-converter which substantially reduces the accumulation of errors during a conversion, compared to conventional D/A-converters.

It is a further object of the invention to provide a D/A-converter which has high accuracy and low sensitivity to circuit realization imperfections.

In particular, it is an object of the invention to provide a cyclic D/A-converter with high accuracy and low accumulation of errors, as well as a high accuracy pipeline D/A-converter.

Another object of the invention is to provide a method for converting a digital input signal into an analog output signal such that low accumulation of offset errors is obtained.

These and other objects are solved by the invention as defined in the accompanying claims.

In accordance with a general inventive concept, a digital input signal, provided in the form of Gray code, is converted into a quantized analog output signal according to an inventive Gray code-to-analog conversion algorithm. Preferably, the Gray code-to-analog algorithm is a recursive algorithm with a predetermined number of recursive steps, generally equal to the number of Gray code bits of the digital input. According to the recursive algorithm, the Gray code bits of the digital input are successively applied in the recursive steps of the algorithm, one Gray code bit for each recursive step, and the analog output signal is generated by recursively updating an intermediate analog signal. In each recursive step, the intermediate analog signal is selectively inverted in dependence on the particular Gray code bit that is applied in that recursive step. The analog output signal is defined as the intermediate signal of the last recursive step.

The selective inversion of the intermediate signal is an inherent property of the Gray code-to-analog algorithm according to the invention, and it is a key factor to considerably reduce the accumulation of errors in a D/A-conversion. Since the input Gray code bits normally vary between the discrete states 0 and 1 more or less randomly, offset errors generated in the conversion will sometimes be added to and sometimes subtracted from the accumulated error. Consequently, the errors will generally not accumulate in an increasing manner, and the total accumulated error in a D/A-conversion according to the invention will lie substantially closer to zero than in a corresponding conventional D/A-conversion.

In a D/A-converter architecture based on the Gray code-to-analog algorithm according to the invention, the accumulation of errors will generally be very low, leading to high tolerance to circuit realization imperfections.

In particular, the Gray code-to-analog algorithm according to the invention is applied to and implemented in cyclic D/A-converters and pipeline D/A-converters. In a cyclic D/A-converter, the algorithm is implemented by using a single functional block, and the input bits are applied to this block cyclically to generate the analog output signal. In a pipeline D/A-converter, the algorithm is implemented sequentially by using a number of functional stages to process the input bits such that each input bit has its own dedicated hardware. In the latter case, the recursiveness of the algorithm is smeared out, in space, in a sequential manner.

In cyclic D/A-conversion, an intermediate analog signal is cyclically updated in response to the Gray code bits of the digital input until a final analog output signal is generated. According to the inventive algorithm, in each cycle of updating the intermediate signal, the Gray code bit applied in that cycle determines whether or not the intermediate analog signal is inverted.

A pipeline D/A-converter comprises a number of cascaded stages, and in pipeline D/A-conversion, an intermediate analog signal is updated through these stages in a pipelined manner in response to the Gray code bits of the digital input until a final analog output signal is generated. Each stage is responsive to a respective one of the input bits, and the input bits are successively applied to the stages of the converter, one bit for each stage, in a discrete-time sequence. According to the inventive algorithm, in each pipeline stage, the Gray code bit applied to that stage determines whether or not the intermediate analog signal is inverted.

The fact that the selective signal inversion is digitally controlled, i.e. determined by the Gray code bits of the digital input, enables high precision implementations which further improve the performance of the inventive D/A-converter.

The D/A-conversion according to the invention offers the following advantages:

high accuracy and low distortion low accumulation of offset errors;

low sensitivity to circuit imperfections; and good dynamic performance.

Other advantages offered by the present invention will be appreciated upon reading of the below description of the embodiments of the invention.

BRIEF DESCRIPTION OF THE DRAWINGS

The novel features believed characteristic of the invention are set forth in the appended claims. The invention itself, however, as well as other features and advantages thereof will be best understood by reference to the detailed description of the specific embodiments which follows, when read in conjunction with the accompanying drawings, wherein:

DETAILED DESCRIPTION

The basic principles according to the present invention are generally applicable to D/A-converters, and particularly to D/A-converters that are subjected to accumulation of errors during a conversion.

However, in this disclosure, the invention will mainly be described with reference to embodiments relating to cyclic D/A-converters, and pipeline D/A-converters. These specific embodiments of the invention are merely given as illustrative examples, and the invention is not limited thereto.

For a better understanding of the present invention it is useful to begin by explaining the principle and operation of conventional cyclic D/A-converters and pipeline D/A-converters that are based on regular binary code.

Conventional cyclic and pipeline D/A-conversion based on regular binary code

In order to avoid misconceptions, the following definition of regular binary code will be used throughout the disclosure. In regular binary code, numbers are expressed as linear combinations of powers of 2:

$$\text{Number} = \sum_{i=1}^{N} b(i) \cdot 2^{N-i},$$

where i and N are integers, and b(i) represents a two-level digit (the i-th bit). The integer N indicates the number of bits, and index i indicates the bit position. A coded number is normally represented as a sequence of bits, where the leftmost bit (i=1) of the sequence is the most significant bit (MSB), and the rightmost bit (i=N) is the least significant bit (LSB). Hereinafter, regular binary code will simply be referred to as binary code.

In general, a cyclic D/A-converter utilizes the same functional components cyclically to convert a digital input signal into an analog output signal. A cyclic D/A-converter normally has a single digital input terminal, and an analog output terminal. In such a D/A-converter, the input bits of the digital input signal are successively applied, one bit for each cycle, to the digital input terminal of the converter, and an intermediate analog signal is cyclically updated in response to the input bits until the final analog output signal is generated.

Figure 1:
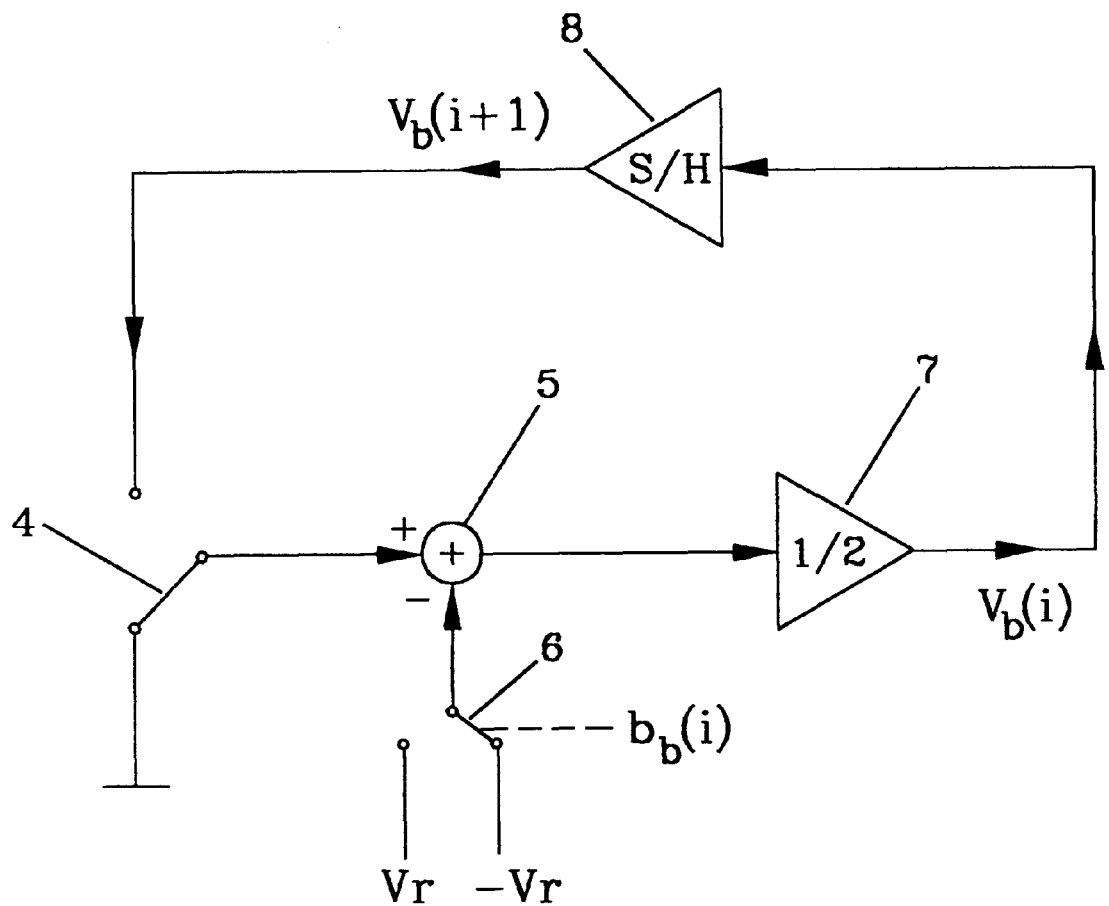
FIG. 1 is a schematic diagram illustrating the basic principle of a conventional binary code cyclic D/A-converter (prior art)

FIG. 1 is a schematic diagram illustrating the basic principle of a conventional cyclic D/A-converter which is based on binary code. The binary code cyclic D/A-converter shown in FIG. 1 comprises the following functional components: a first switch 4, an adder/subtractor 5, a second switch 6, an amplifier 7 with a gain factor equal to 0.5, and a sample/hold circuit 8. Clock signals are normally utilized to control the operation of the cyclic D/A-converter, i.e. functional components thereof. These clock signals are generated by a conventional clock signal generator (not shown).

Consider, as a general example, an N-bit cyclic D/A-converter. Accordingly, the digital input signal comprises N input bits $b_b(i)$, where i goes from N to 1. Note that the $b_b(N)$ designates the least significant bit (LSB) and $b_b(1)$ the most significant bit (MSB). The input bits $b_b(i)$ are successively applied to the digital input terminal (indicated by the dotted line) of the cyclic D/A-converter, and a conversion starts with the LSB and ends with the MSB. The subscript b indicates that the digital input is given in binary code.

The actual D/A-conversion starts by connecting the first switch 4 to ground, thus defining an initial analog signal $V_b(N+1)$ which is equal to zero. The first switch 4 is also connected to the adder/subtractor 5 which receives the initial analog signal $V_b(N+1)=0$. The input bit, in this case $b_b(N)$, currently applied to the cyclic D/A-converter determines whether a reference signal Vr is added to or subtracted from the initial analog signal $V_b(N+1)$. More specifically, the currently applied input bit $b_b(N)$ controls the second switch 6 such that either the reference signal Vr or its inverse −Vr will be switched into connection with the adder/subtractor 5 and subtracted from the initial analog signal. The output signal of the adder/subtractor 5 is sent to the amplifier 7 which amplifies the signal by a factor of 0.5. The output signal of the amplifier 7 is defined as an intermediate analog signal $V_b(N)$. This intermediate analog signal $V_b(N)$ is sampled by the sample/hold circuit 8. Now, the first switch 4 is connected to the output of the sample/hold circuit 8, thus closing the loop and enabling signal circulation. At this point, the intermediate signal $V_b(N)$ sampled and held by the sample/hold circuit 8, is released and passed to the adder/subtractor 5, and the next input bit $b_b(N-1)$ is applied to the digital input terminal. This input bit $b_b(N-1)$ determines whether the reference signal Vr or its inverse −Vr is added to the intermediate signal $V_b(N)$. The output signal of the adder/subtractor 5 is amplified in the amplifier 7 to generate an updated intermediate analog signal $V_b(N-1)$ associated with the input bit $b_b(N-1)$. Once again, the sample/hold circuit 8 samples and holds the output signal of the amplifier 7.

In each cycle of the cyclic D/A-converter, the intermediate signal is updated by means of the adder/subtractor 5, the digitally controlled second switch 6 and the amplifier 7. In general, an updated intermediate signal $V_b(i)$ is generated based on the previous intermediate signal $V_b(i+1)$ and the current input bit $b_b(i)$.

The first switch 4 is connected to the output of the sample/hold circuit 8 during all cycles, and the operation continues until the most significant bit (MSB) has been applied to the cyclic D/A-converter. Then the output signal of the amplifier 7 or the output signal of the sample/hold circuit 8 is extracted, switched out of the converter loop, as the final analog output signal of the cyclic D/A-converter. A new cyclic D/A-conversion is started by once again connecting the first switch 4 to ground.

With the intention of briefly explaining the principle and operation of a conventional pipeline D/A-converter based on regular binary code, reference will now be made to FIG. 2. The binary code pipeline D/A-converter 10 is a discrete-time N-bit D/A-converter which comprises a number, N, of signal processing stages that are connected in cascade (in series). For illustrative purposes, all stages are not shown explicitly. In general, each stage has an analog input terminal, an analog output terminal and a digital input terminal. The analog output terminal of a stage is connected to the analog input terminal of the following stage. Each stage is responsive to a respective one of the input bits $b_b(i)$, also referred to as the i-th MSB, of the digital input signal. In operation, the input bits $b_b(i)$ are successively applied to the stages of the converter, one bit for each stage, in a discrete-time sequence, and an intermediate analog signal $V_b(i)$ is updated by the signal processing stages of the converter in a pipelined manner until a final analog output signal $V_b(1)=V_{bout}$ is generated in the last stage. By definition, when the last stage has generated its analog output signal $V_b(1)$, the D/A-conversion is completed.

Figure 2:
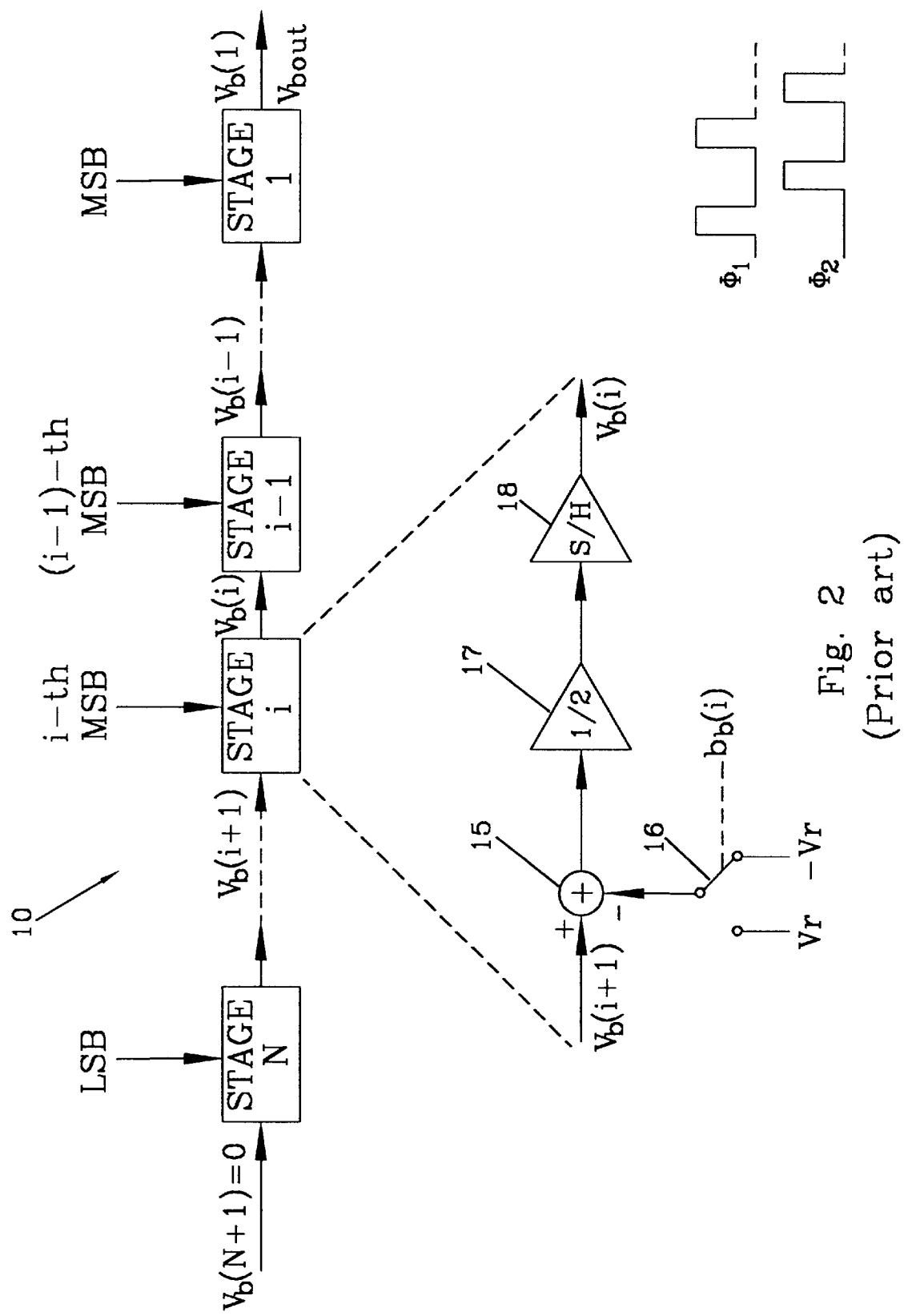
FIG. 2 is a schematic diagram illustrating the basic principle of a conventional binary code pipeline D/A-converter (prior art)

The signal processing stages of the binary code pipeline D/A-converter are typically controlled by non-overlapping clock signals, such as $\Phi_1$ and $\Phi_2$ shown in FIG. 2, in combination with some sort of sample-and-hold circuitry provided in each stage. This ensures discrete-time operation of the converter. If, as an example, stage i receives the i-th MSB to generate the intermediate analog signal $V_b(i)$ on clock phase $\Phi_2$, then stage (i−1) receives the (i−1)-th LSB to generate the intermediate analog signal $V_b(i-1)$ on clock phase $\Phi_1$ and so on.

In FIG. 2 there is also illustrated a more detailed representation of a single stage of the conventional pipeline D/A-converter. The pipeline stage of FIG. 2 basically comprises the following functional components: an adder/subtractor 15, a switch 16, an amplifier 17 with a gain factor equal to 0.5, and a sample/hold circuit 18.

The pipeline stage of FIG. 2 operates as follows. The input signal, i.e. the intermediate signal $V_b(i+1)$, to the i-the stage is passed to the adder/subtractor 15. The input bit $b_b(i)$ applied to the i-th stage controls the switch 16 such that either the reference signal Vr or its inverse −Vr will be switched into connection with the adder/subtractor 15 and subtracted from the input signal $V_b(i+1)$. The output signal of the adder/subtractor 15 is sent to the amplifier 17 which amplifies the signal by a factor of 0.5. The output signal of the amplifier 17 is sampled and held by the sample/hold circuit 18. In the next clock phase, the sampled and held signal of the S/H-circuit 18 is released and passed to the next stage as the intermediate signal $V_b(i)$.

A pipeline D/A-converter is generally considered to be a high speed converter. In order to fully utilize the high speed capacity of a pipeline D/A-converter, the converter normally performs a number of D/A-conversions "simultaneously". Once a signal processing stage has updated the intermediate analog signal in response to the input bit of a first digital code value, and transferred the intermediate signal to the next stage, it is ready to receive an input bit of a second digital code value. In this way, the pipeline D/A-converter may simultaneously process input bits of different digital code values in different stages of the converter. This line of operation is made possible because of the discrete-time operation of the pipeline D/A-converter and increases the throughput of the converter.

By comparing the conventional cyclic D/A-converter of FIG. 1 and the conventional pipeline D/A-converter of FIG. 2, it will be appreciated that the two types of D/A-converters are very similar to each other. The cyclic D/A-converter of FIG. 1 comprises the same functional components as the pipeline stage of FIG. 2. The main difference is that the cyclic converter uses the components cyclically, whereas the pipeline converter uses several duplicated stages of these components in a pipelined manner.

In fact, both the binary code cyclic D/A-converter of FIG. 1 and the binary code pipeline D/A-converter of FIG. 2 can be summarized by the same algorithm. This algorithm is defined by the following equations:

$$V_b(N+1) = 0 \tag{1.1}$$

$$V_b(i) = \frac{1}{2} \cdot (V_b(i+1) - (-1)^{b_b(i)} \cdot V_r), \, i = N, N-1, \ldots, 1$$

$$V_{bout} = V_b(1).$$

where $b_b(i)$ denotes the i-th MSB of the digital input signal. N represents the number of bits of the digital input, and i is an integer value ranging from N to 1. Note that $b_b(1)$ designates the MSB and $b_b(N)$ the LSB. The subscript b indicates that the digital input is in the form of binary code. $V_b(i)$ represents the intermediate signal associated with the i-th MSB, and $V_r$ is a predetermined reference signal.

By iterating eq. (1.1) until i=1, the following expression is obtained:

$$V_{bout} = V_b(1) = -\sum_{i=1}^{N} \frac{(-1)^{b_b(i)}}{2^i} \cdot V_r. \tag{1.2}$$

It is evident from eq. (1.2) that the analog output $V_{bout}$ is proportional to the binary digital input bits. When the digital input bit is 1, a weighted reference is added to the analog output, whereas when the digital input bit is 0, a weighted reference is subtracted from the analog output. The weighting is determined by the bit position as indicated in eq. (1.2).

In order to more easily understand the operation of conventional binary code cyclic and pipeline D/A- converters, an illustrative example of an ideal 4-bit D/A-conversion will be described with reference to FIGS. 1 and 2 and eq. (1.1). In this particular example, assume that the digital input signal is equal to 0110, given in binary code with the leftmost bit as the MSB, and the rightmost bit as the LSB. Furthermore, assume that the reference signal corresponds to a voltage of 1.0 V and that the analog signals also are expressed in terms of voltage. The intermediate signal $V_b(i)$ will change in each recursion/iteration according to the recursive formula of eq. (1.1), where i goes from 4 to 1. The final analog output signal is defined as $V_b(^1)$. The D/A-conversion starts by defining the initial analog signal $V_b(N+1)$ as $V_b(5)=0$ V.

Digital input: 0110.
Applying the 4-th MSB, i.e. the LSB, i=4:
$b_b(4)=0$, and
$V_b(^4)=0.5 \cdot (0-(-1)^0 \cdot 1.0)=0.5 \cdot (0-(1.0))=-0.5$ V
Applying the 3-rd MSB, i=3:
$b_b(^3)=1$, and
$V_b(3)=0.5 \cdot (-0.5-(-1)^1 \cdot 1.0)=0.5 \cdot (-0.5-(-1.0))=0.25$ V
Applying the 2-nd MSB, i=2:
$b_b(^2)=1$, and
$V_b(^2)=0.5 \cdot (0.25-(-1)^1 \cdot 1.0)=0.5 \cdot (0.25-(-1.0))=0.625$ V
Applying the MSB, i=1:
$b_b(1)=0$, and
$V_b(1)=0.5 \cdot (0.625-(-1)^0 \cdot 1.0)=0.5 \cdot (0.625-1.0)=-0.1875$ V.

Accordingly, with a reference voltage of 1.0 V corresponding to a nominal full scale level, the digital input 0110 was converted into the quantized analog output signal of −0.1875 V.

It should be noted that the conventional D/A-converter performing the above illustrative D/A-conversion is bipolar, i.e. the analog output signal may represent positive as well as negative voltages. With the conditions given in the example given above, the voltage of the quantized analog output signal may lie in the range between −0.9375 V (when the digital input code is 0000) and +0.9375 V (when the digital input code is 1111) with a resolution of 0.125 V.

However, conventional cyclic and pipeline D/A-converters based on binary code suffer from high sensitivity to offset errors caused by circuit realization imperfections. In practical D/A-converter realizations, offset errors originate from e.g. the DC offset in the circuit and clock induced charge injections. Of course other types of errors such as low-frequency noise are generally also produced in the conversion. Anyway, in generating the intermediate analog signal $V_b(i)$ (where i goes from N to 1), an error $\Delta V_b(i)$ will be generated. The errors generated in a conversion will propagate through and accumulate in the conventional D/A-converter. Referring to eq. (1.1) above with consideration to the error produced in generating each intermediate signal, the following equation results:

$$V_b(i) = \frac{1}{2} \cdot (V_b(i+1) - (-1)^{p_b(i)} \cdot V_r + \Delta V_b(i)), i = N, N-1, \ldots, 1 \quad (1.3)$$

Because of the structure of the conventional binary code cyclic and pipeline D/A-converters, the errors will accumulate in a strictly increasing manner. This can be seen by iterating equation (1.3) down until i=1, with the following result:

$$V_{bout} = V_b(i) = -\sum_{i=1}^{N} \frac{(-1)^{p_b(i)}}{2^i} \cdot V_r + \sum_{i=1}^{N} \frac{1}{2^i} \cdot \Delta V_b(i). \quad (1.4)$$

The total accumulated error in the final analog output signal for a conventional N-bit cyclic or pipeline D/A-converter based on binary code, is given by:

$$\Delta V_{bout} = \sum_{i=1}^{N} \frac{1}{2^i} \cdot \Delta V_b(i). \quad (1.5)$$

Since errors due to offset generally have the same sign, these errors are truly accumulated, limiting the accuracy and increasing the distortion of conventional binary code cyclic and pipeline D/A-converters.

D/A-conversion according to the invention

The general idea according to the present invention is to perform digital-to-analog conversion of a digital input signal into a quantized analog output signal according to an inventive Gray code-to-analog conversion algorithm.

In D/A-converter architectures based on the Gray code-to-analog conversion algorithm according to the invention, the accumulation of errors during a conversion will be low. In particular, when compared to corresponding conventional binary code D/A-converters, the error accumulation will be substantially reduced.

Before giving a specific example of a Gray code-to-analog conversion algorithm according to the invention, the concept of Gray code will be explained briefly.

Gray code

In general, Gray code is known as a sequence of bit patterns in which adjacent patterns differ in only a single bit. The Gray code structure is most easily understood by studying table I given below. Table I illustrates 4-bit Gray code to the left, 4-bit binary code in the middle, and corresponding decimal numbers to the right.

TABLE I

| Gray | Binary | Decimal |
| --- | --- | --- |
| 0000 | 0000 | 0 |
| 0001 | 0001 | 1 |
| 0011 | 0010 | 2 |
| 0010 | 0011 | 3 |
| 0110 | 0100 | 4 |
| 0111 | 0101 | 5 |
| 0101 | 0110 | 6 |
| 0100 | 0111 | 7 |
| 1100 | 1000 | 8 |
| 1101 | 1001 | 9 |
| 1111 | 1010 | 10 |
| 1110 | 1011 | 11 |
| 1010 | 1100 | 12 |
| 1011 | 1101 | 13 |
| 1001 | 1110 | 14 |
| 1000 | 1111 | 15 |

In both types of code, Gray code and binary code, the rightmost bit is the least significant bit (LSB). It should however be realized that in Gray code, no specific bit weights can be assigned to the bits of the coded values. Gray code is sometimes described as a reflection code, because all the positions of a Gray code value except for the leftmost bit position (MSB) appear as a reflection around a reflection line, whereas the leftmost position changes logical state.

Gray code has been used in connection with D/A-converters in the prior art:

U.S. Pat. No. 5,424,740 issued to Chang et al. on Jun. 13, 1995 discloses a D/A-converter which has a generator responsive to a digital input signal which is encoded into Johnson code or Gray code for generating a control signal decoded from the Johnson code, a set of switches being connected to the generator and responsive to the control signal, and first and second terminals connecting therebetween a resistor device with a plurality of nodes connected to the switches. A node voltage is obtained between one of the nodes a one of the terminals to serve as an analog signal. The D/A-converter of Chang et al. uses Johnson code or Gray code as an intermediate step to generate a control signal.

U.S. Pat. No. 4,591,826 issued to Seiler on May 27, 1986 discloses a D/A-converter ladder using Gray code so as to have inherent monotonicity.

The German patent application DE 34 13 456 A1 discloses a D/A-converter with a Gray code input signal. The D/A-converter is a convolution-type converter which uses Gray code to facilitate the convolution. Each bit stage is assigned a convolutional current amplifier with a summing curve. In addition, no sample-and-hold functionality is associated with the bit stages, and the convolution-type converter of DE 34 13 456 A1 is not at all relevant to D/A-architectures, such as cyclic and pipeline architectures, in which a sample-and-hold is required.

The German patent application DE 34 00 061 A1 discloses a D/A-converter for sine/cosine-signals which has switches that are controlled by Gray codes.

A preferred Gray code-to-analog conversion algorithm according to the invention

Now, the basic principles of the present invention will be explained with reference to an illustrative and preferred form of an inventive Gray code-to-analog conversion algorithm. The inventive algorithm given below is customized for cyclic and pipeline D/A-converters, but it should be understood that the general idea according to the invention is not limited thereto.

Assume that the digital input signal has a predetermined integer number, N, of Gray code bits $b_g(i)$, where i is an integer ranging from N to 1, and that the analog output signal $V_{gout}$ is generated by using a predetermined reference signal $V_r$. According to a preferred embodiment of the invention, a Gray code-to-analog algorithm is defined by the following equations:

$$V_g(N+1) = 0; \quad (2.1)$$

$$V_g(i) = \frac{1}{2} \cdot [V_g(i+1) - V_r] \cdot (-1)^{b_g(i)}, i = N, N-1, \ldots, 1;$$

$$V_{gout} = V_g(1).$$

where $b_g(i)$ denotes the i-th MSB of the digital input signal. Note that $b_g(1)$ designates the MSB and $b_g(N)$ the LSB. The subscript g indicates that the digital input is in the form of Gray code. $V_g(i)$ represents an intermediate analog signal associated with the i-th MSB. The intermediate analog signal $V_g(i)$, the analog output signal $V_{gout}$ and the reference signal $V_r$ can e.g. be representative of charges, voltages or currents depending on the chosen circuit realization.

By iterating eq. (2.1) until i=1, the following expression is obtained:

$$V_{gout} = V_g(1) = -\left\{ \sum_{i=1}^{N} \frac{1}{2^i} (-1)^{\sum_{j=1}^{i} b_g(j)} \right\} \cdot V_r. \quad (2.2)$$

Notice that the digital inputs are Gray codes instead of binary codes and that the formula of eq. (2.1) differs significantly from that of eq. (1.1) for conventional binary code D/A-conversion.

For a better understanding of the inventive Gray code-to-analog algorithm, an illustrative example of an ideal 4-bit Gray code-to analog conversion will now be described with reference to eq. (2.1). In order to be able to compare conventional binary code D/A-conversion and the Gray code-to-analog conversion according to the invention, the Gray code value that corresponds to the binary code 0110 used as digital input in the example of the conventional binary code D/A-conversion above, is chosen as digital input. By using Table I above, it can be seen that the Gray code value 0101 corresponds to the binary code value 0110. Hence, the Gray code input and the binary code input are consistent with each other, although they are given in different types of code. In addition, consider the same reference voltage, 1.0 V, as in the example with the ideal binary code D/A-conversion above. Also, assume that the analog signals are expressed in terms of voltages in this particular example. The intermediate signal $V_g(i)$ will change in each recursion/iteration according to the recursive formula of eq. (2.1), where i goes from 4 to 1. The final analog output signal is defined as $V_g(1)$. The analog output signal may represent positive as well as negative voltages, and the voltage of the quantized output signal may lie in the range between −0.9375 V (when the digital input code is 0000) and +0.9375 V (when the digital input code is 1000) with a resolution of 0.125 V. The D/A-conversion according to the invention starts by defining the initial analog signal $V_g(N+1)$ as $V_g(5)=0$ V.

Digital input (in the form of Gray code): 0101.
Applying the 4-th MSB, i.e. the LSB, i=4:
$b_g(4)=1$, and
$V_g(4)=0.5\cdot(0-1.0)\cdot(-1)^1=0.5\cdot(-1.0)\cdot(-1)=0.5$ V
Applying the 3-rd MSB, i=3:
$b_g(3)=0$, and
$V_g(3)=0.5\cdot(0.5-1.0)\cdot(-1)^0=0.5\cdot(-0.5)\cdot1=-0.25$ V
Applying the 2-nd MSB, i=2:
$b_g(2)$ 1, and
$V_g(2)=0.5\cdot(-0.25-1.0)\cdot(-1)^1=0.5\cdot(-1.25)\cdot(-1)=0.625$ V
Applying the MSB, i=1:
$b_g(1)=0$, and
$V_g(1)=0.5\cdot(0.625-1.0)\cdot(-1)^0=0.5\cdot(-0.375)\cdot1=-0.1875$ V Accordingly, with a reference voltage of 1.0 V corresponding to a nominal full scale level, the Gray code input 0101 was converted into the quantized analog output signal of −0.1875 V, which is exactly the same output voltage as in the conventional binary code D/A-conversion of the binary code input 0110.

In general, it can be shown that the Gray code D/A-conversion according to the invention has the same ideal characteristics with regard to the analog output signal as a corresponding conventional binary code D/A-conversion. By definition, binary code to Gray code conversion is given by:

$$b_g(1)=b_b(1);$$

$$b_g(i)=b_b(i)\oplus b_b(i-1), \quad (2\leq i \leq N) \tag{2.3}$$

where the subscript g designates Gray code bits, the subscript b designates binary code bits and $\oplus$ denotes the exclusive OR operation. A simple calculation reveals that:

$$(-1)^{b_b(i)\oplus b_b(i-1)}=(-1)^{b_b(i)+b_b(i-1)}. \tag{2.4}$$

Therefore, the following relation results:

$$(-1)^{\sum_{j=1}^{i} b_g(j)} = \tag{2.5}$$
$$(-1)^{\{\sum_{j=2}^{i}[b_b(j)+b_b(j-1)]+b_b(1)\}} = (-1)^{b_b(i)+2\cdot\sum_{j=1}^{i-1}b_b(j)} = (-1)^{b_b(i)}.$$

Inserting eq. (2.5) into eq. (2.2) gives:

$$V_{gout} = V_g(1) = \tag{2.6}$$
$$-\left\{\sum_{i=1}^{N} \frac{1}{2^i}(-1)^{\sum_{j=1}^{i} b_g(j)}\right\} \cdot V_r = -\sum_{i=1}^{N} \frac{(-1)^{b_b(i)}}{2^i} \cdot V_r = V_{bout}.$$

It is seen from relation (2.6) that the Gray code D/A-conversion according to the invention and the conventional binary code D/A-conversion are mathematically consistent with each other.

However, the propagation of offset errors in the Gray code D/A-conversion according to the invention differs completely from that in conventional binary code D/A-conversion. Offset errors due to imperfections in the circuit realization, will normally be generated in all D/A-converters. These offset errors may originate from e.g. DC-offsets and low-frequency noise in the circuit. As an example, in switched-capacitor realizations, the main contribution to the offset is normally due to clock induced charge injections in the clock controlled switches and other DC-offsets. Assume that an error $\Delta V_g(i)$ will be produced in generating the intermediate analog signal $V_g(i)$ (where i goes from N to 1). In D/A-converters based on the Gray code-to-analog conversion algorithm according to the preferred embodiment of the invention, the offset error will not necessarily accumulate in an increasing manner. Referring to eq. (2.1) above with consideration to the error $\Delta V_g(i)$ produced in generating each intermediate signal, the following equation results:

$$V_g(i) = \frac{1}{2} \cdot [V_g(i+1) - V_r + \Delta V_g(i)] \cdot (-1)^{b_g(i)}. \tag{2.7}$$

By iterating equation (2.7) down until i=1, the result will be:

$$V_{gout} = V_g(1) = -\left\{\sum_{i=1}^{N} \frac{1}{2^i}(-1)^{\sum_{j=1}^{i} b_g(j)}\right\} \cdot V_r + \tag{2.8}$$
$$\sum_{i=1}^{N}\left\{\frac{1}{2^i} \cdot (-1)^{\sum_{j=1}^{i} b_g(j)} \cdot \Delta V_g(i)\right\}.$$

Therefore, the total accumulated error in the final analog output signal of an N-bit D/A-conversion according to the Gray code-to-analog algorithm of the invention, is given by:

$$\Delta V_{gout} = \sum_{i=1}^{N}\left\{\frac{1}{2^i} \cdot (-1)^{\sum_{j=1}^{i} b_g(j)} \cdot \Delta V_g(i)\right\}. \tag{2.9}$$

Now, compare the total accumulated error for the conventional binary code D/A-conversion and the inventive Gray code D/A-conversion by studying eq. (1.5) and eq. (2.9). In order to more easily compare eq. (1.5) and eq. (2.9) first combine eq. (2.5) and eq. (2.9):

$$\Delta V_{gout} = \tag{2.10}$$
$$\sum_{i=1}^{N}\left\{\frac{1}{2^i} \cdot (-1)^{\sum_{j=1}^{i} b_g(j)} \cdot \Delta V_g(i)\right\} = \sum_{i=1}^{N} \frac{(-1)^{b_b(i)}}{2^i} \cdot \Delta V_g(i).$$

Because the offset errors generally have the same sign independent of i, and assuming that $\Delta V_g(i)=\Delta V_b(i)$, the following relation results:

$$|\Delta V_{gout}| = \left|\sum_{i=1}^{N} \frac{(-1)^{b_b(i)}}{2^i} \cdot \Delta V_g(i)\right| \leq \left|\sum_{i=1}^{N} \frac{1}{2^i} \cdot \Delta V_g(i)\right| = \tag{2.11}$$
$$\left|\sum_{i=1}^{N} \frac{1}{2^i} \cdot \Delta V_b(i)\right| = |\Delta V_{bout}|.$$

Strictly mathematically speaking, equation (2.11) shows that the absolute value of the total accumulated error in an N-bit Gray code D/A-conversion according to the invention is smaller than or equal to the absolute value of the total accumulated error in a corresponding N-bit binary code D/A-conversion. In practice, however, the Gray code accumulated error will generally be considerably smaller than the binary code accumulated error. It is useful to give a brief and intuitive explanation of this fact. According to the Gray code-to-analog conversion algorithm of the invention, in each recursion or iteration, the intermediate analog signal is selectively inverted depending on the particular Gray code bit that is applied in the recursion (iteration). This selective inversion of the intermediate signal is an inherent property of the Gray code-to-analog algorithm according to the invention, and it is a key factor to considerably reduce the accumulation of errors in a D/A-conversion. Since the input Gray code bits normally vary between the discrete states 0 and 1 more or less randomly, offset errors generated in the conversion will sometimes be added to and sometimes subtracted from the accumulated error at that point. Consequently, the errors will generally not accumulate in an increasing manner, and the total accumulated error in a Gray code D/A-conversion according to the invention will lie substantially closer to zero than in a corresponding conventional binary code D/A-conversion.

Accordingly, with regard to the sensitivity to circuit imperfections, D/A-converters based on the Gray code-to-analog algorithm according to the invention have a significant advantage over its binary code counterparts.

For illustrative purposes, the error accumulation in a Gray code D/A-conversion according to the invention and the error accumulation in a corresponding binary code D/A-conversion, will be compared in the following. Consider, as an example, the 4-bit binary code 0110, and the corresponding 4-bit Gray code 0101. Since 4-bit code values are considered in this particular example, N is equal to 4. The offset error in generating each intermediate signal is assumed to be +0.02 V.

Binary code accumulated error:

According to equation (1.5) for a conventional binary code D/A-conversion, the total accumulated error in converting the binary code 0110 ($b_b(1)=0$, $b_b(2)=1$, $b_b(3)=1$, $b_b(4)=0$) will be:

$$\Delta_{bout} = \frac{1}{2} \cdot 0.02 + \frac{1}{4} \cdot 0.02 + \frac{1}{8} \cdot 0.02 + \frac{1}{16} \cdot 0.02 = 0.01875V.$$

Gray code accumulated error:

According to equation (2.9) for a Gray code D/A-conversion according to the invention, the total accumulated error in converting the Gray code 0101 ($b_g(1)=0$, $b_g(2)=1$, $b_g(3)=0$, $b_g(4)=1$) will be:

$$\Delta V_{gout} = \frac{1}{2} \cdot (-1)^0 \cdot 0.02 + \frac{1}{4} \cdot (-1)^{0+1} \cdot 0.02 + \frac{1}{8} \cdot (-1)^{0+1+0} \cdot 0.02 +$$
$$\frac{1}{16} \cdot (-1)^{0+1+0+1} \cdot 0.02 = \frac{1}{2} \cdot 0.02 - \frac{1}{4} \cdot 0.02 - \frac{1}{8} \cdot 0.02 + \frac{1}{16} \cdot 0.02 =$$
$$0.01 - 0.005 - 0.0025 + 0.00125 = 0.00375V.$$

It can be seen that $|\Delta V_{gout}|<|\Delta V_{bout}|$. The Gray code error accumulation according to the invention is generally considerably lower than the binary code error accumulation, because the sign associated with the errors are positive as well as negative. This is a property directly related to the selective signal inversion of the inventive Gray code-to-analog algorithm, resulting in the term $(-1)^{\sum_{j=1}^{i} b_g(i)}$ in eq. (2.9).

Figure 3:
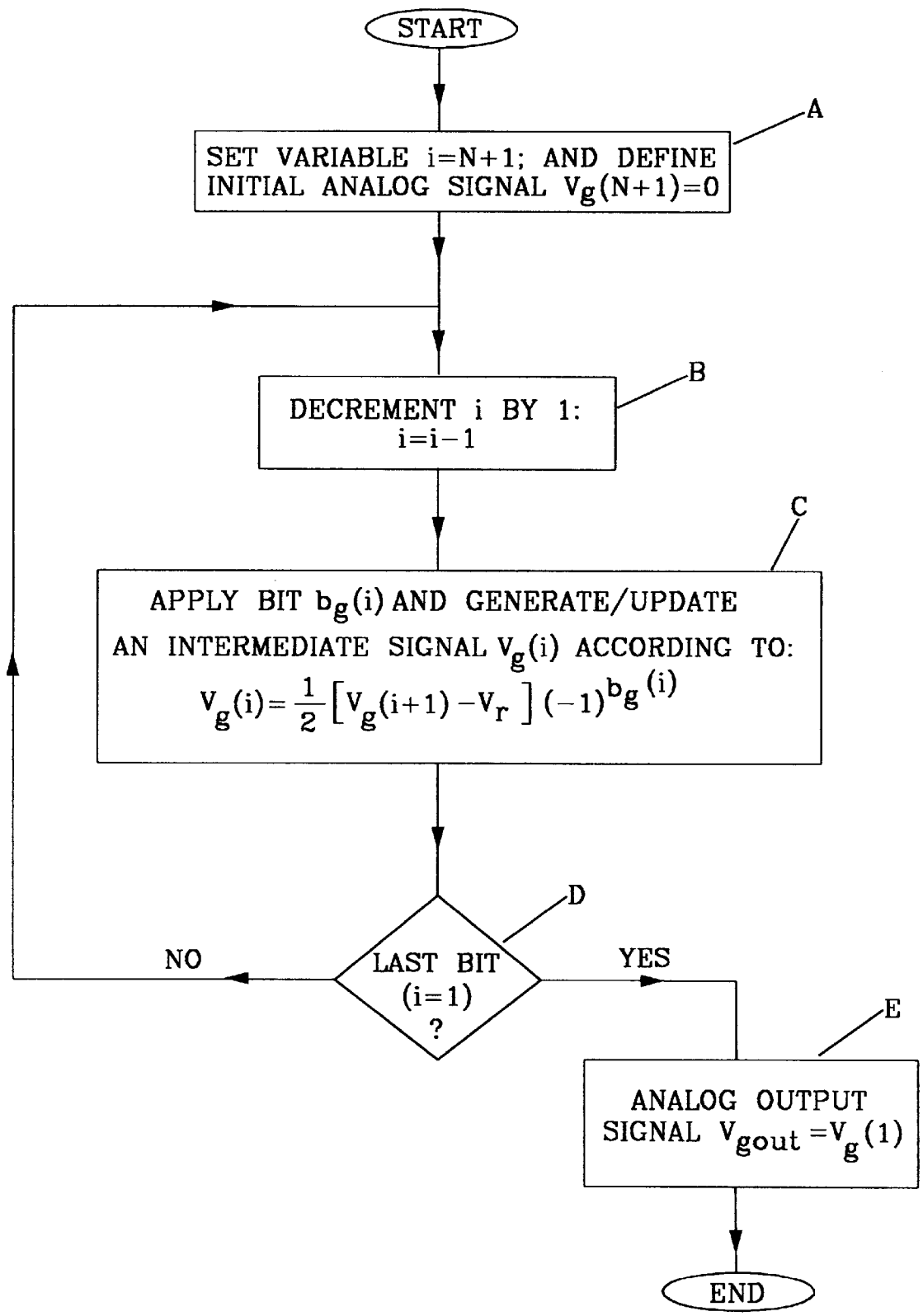
FIG. 3 is a schematic flow diagram of a method for converting a digital input signal into an analog output signal in accordance with the invention.

FIG. 3 is a schematic flow diagram of a method for converting a digital input signal into an analog output signal in accordance with a preferred embodiment of the invention. It is assumed that the digital input signal has a predetermined integer number, N, of Gray code input bits $b_g(i)$, where i is an integer ranging from N to 1. The D/A-conversion according to the invention basically works as follows. In step A, the variable i is initially set to N+1, and an initial analog signal $V_g(N+1)=0$ is defined. Next, in step B, the variable i is decremented by 1. In step C, the input bit $b_g(i)$ is applied in the D/A-conversion and an intermediate analog signal $V_g(i)$ is generated/updated according to the following expression:

$$V_g(i) = \frac{1}{2} \cdot [V_g(i+1) - V_r] \cdot (-1)^{b_g(i)}.$$

In step C, the intermediate analog signal $V_g(i)$ is generated/updated by subjecting the previous intermediate signal $V_g(i+1)$ to a subtraction of a predetermined reference signal $V_r$, subsequently to an amplification by 0.5 and selectively, depending on the applied Gray code bit $b_g(i)$, to a signal inversion. At this point i is equal to N, indicating that the initial analog signal $V_g(N+1)$ is used as previous intermediate signal and that the input bit $b_g(N)$, i.e. the Gray code LSB, is applied in the D/A-conversion. If i is equal to 1, i.e. if all the bits of the digital input signal have been applied (YES) at this point, step D, the D/A-conversion is completed and the procedure ends by defining the analog output signal $V_{gout}$ as the final intermediate signal $V_g(1)$ in step E. However, the digital input signal generally comprises more than a single bit such that N is greater than 1 (NO), and the procedure returns to step B. In step B, the variable i is once again decremented by 1. At this point i=N−1, indicating that the next input bit $b_g(N-1)$ is to be applied in the D/A-conversion. The intermediate analog signal is updated, and the procedure continues in accordance with the flow diagram until i=1 and all N Gray code bits have been applied in the D/A-conversion.

A new D/A-conversion is initiated by once again defining the initial analog signal in step A, and starting to apply the Gray code input bits, one by one.

It should be understood that the specific order of the amplification and the selective signal inversion in step C generally is not critical for the D/A-conversion according to the invention. It is possible to perform the selective inversion before the amplification.

The D/A-conversion method described above with reference to FIG. 3 is preferably implemented in a cyclic manner or in a pipelined manner. Cyclic D/A-conversion is performed by using the same hardware cyclically, whereas pipeline D/A-conversion is performed by using dedicated hardware for each input bit, all as will be explained in more detail below. In addition, it should be understood that hybrids of cyclic and pipeline D/A-conversion are possible. Accordingly, the above method is alternatively implemented by a combination of the cyclic approach and the pipeline approach.

It has been shown that the accumulation of errors will generally be very low in a D/A-conversion based on the Gray code-to-analog algorithm according to the invention. In the following, hardware implementations of the preferred form of the Gray code-to-analog conversion algorithm into cyclic and pipeline D/A-converters will be described.

Figure 4:
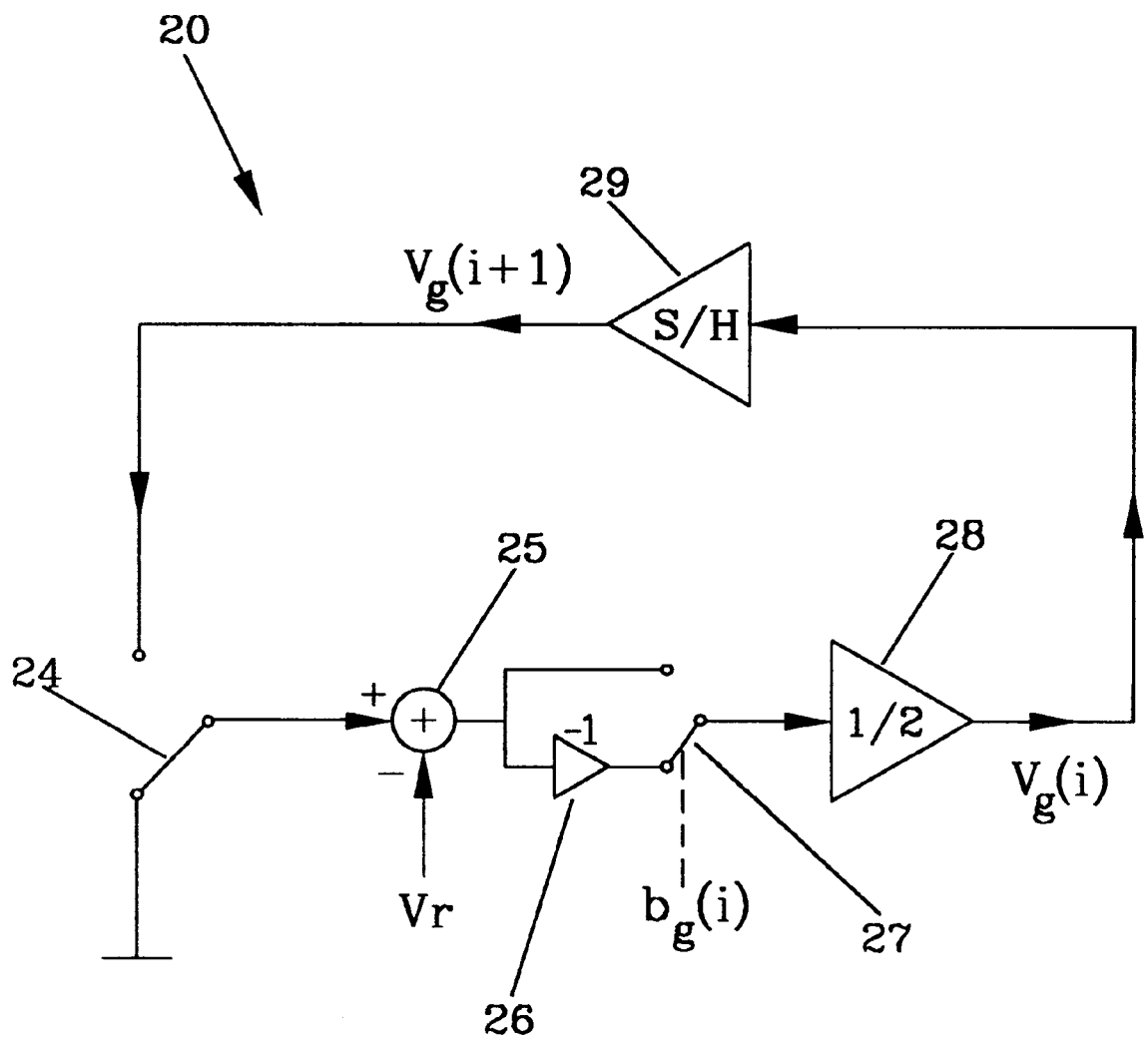
FIG. 4 is a schematic block diagram illustrating the basic principle of a cyclic D/A-converter according to the invention.

Implementations of the inventive Gray code-to-analog algorithm into cyclic D/A-converters FIG. 4 is a schematic block diagram illustrating the basic principle of a cyclic D/A-converter according to the invention. The cyclic D/A-converter 20 basically comprises the following functional components: a first switch 24, an adder/subtractor 25, an inverter 26, a second switch 27, an amplifier 28 with a gain factor equal to 0.5, and a sample/hold circuit 29. There is also provided a digital input terminal (indicated by the dotted line) for successively receiving the Gray code bits, one Gray code bit for each cycle of the cyclic D/A-converter 20. Non-overlapping clock signals are normally utilized to control the operation of the cyclic D/A-converter, i.e. functional components thereof. These clock signals are generated by a conventional clock signal generator (not shown in FIG. 4).

Consider, as a general example, an N-bit cyclic D/A-converter. Accordingly, the digital input signal comprises N Gray code input bits $b_g(i)$, where i goes from N to 1. Note that $b_g(N)$ designates the least significant bit (LSB) and $b_g(1)$ the most significant bit (MSB). The input bits $b_g(i)$ are successively applied to the digital input terminal of the cyclic D/A-converter, and a conversion starts with the LSB and ends with the MSB.

The actual D/A-conversion starts by connecting the first switch 24 to ground, thus defining an initial analog signal $V_g(N+1)$ which is equal to zero. The first switch 24 is also connected to the adder/subtractor 25 which receives the initial analog signal $V_g(N+1)=0$. The adder/subtractor 25 is also responsive to a reference signal Vr which is subtracted from the initial analog signal $V_g(N+1)$. The Gray code input bit, in this case $b_g(N)$, currently applied to the cyclic D/A-converter determines whether the output signal of the adder/subtractor 25 or its inverse is fed forward in the converter. The signal inversion is carried out by the signal inverter 26. The second switch 27 is controlled by the applied Gray code bit such that either the output signal of the adder/subtractor 25 or its inverse will be switched into connection with the amplifier 28. The amplifier 28 amplifies the incoming signal by a factor of 0.5. The output signal of the amplifier 28 is defined as an intermediate analog signal $V_g(N)$ associated with the input bit $b_g(N)$ This intermediate analog signal $V_g(N)$ is sampled by the sample/hold circuit 29. Next, the first switch 24 is connected from ground to the output of the sample/hold circuit 29, thus closing the converter loop and enabling signal circulation. At this point, the intermediate signal $V_g(N)$ sampled and held by the sample/hold circuit 29, is released and passed to the adder/subtractor 25. The adder/subtractor 25 subtracts the reference signal Vr from the intermediate signal $V_g(N)$i and the signal inverter 26 performs a signal inversion of the added/subtracted signal. The next Gray code bit $b_g(N-1)$ is applied to the digital input terminal and it determines whether the output signal from the adder/subtractor 25 or its inverse, coming from the signal inverter 26, is switched into connection with the amplifier 28. The signal fed forward by the second switch 27 is amplified in the amplifier 28 to generate an updated intermediate analog signal $V_g(N-1)$ associated with the input bit $b_g(N-1)$. Once again, the sample/hold circuit 29 samples and holds the output signal of the amplifier 28.

In each cycle of the cyclic D/A-converter according to the invention, the intermediate signal is updated by means of the adder/subtractor 25, the signal inverter 26, the digitally controlled second switch 27 and the amplifier 28. In general, an updated intermediate signal $V_g(i)$ is generated based on the previous intermediate signal $V_g(i+1)$ and the current Gray code input bit $b_g(i)$.

The first switch 24 is connected to the output of the sample/hold circuit 29 in all cycles, and the operation continues until the most significant bit (MSB) has been applied to the cyclic D/A-converter. Then the output signal of the amplifier 28 or the output signal of the sample/hold circuit 29 is extracted, switched out of the converter loop, as the final analog output signal of the cyclic D/A-converter 20. A new cyclic D/A-conversion is started by once again connecting the first switch 24 to ground.

The cyclic D/A-converter 20 of FIG. 4 is a direct realization of the inventive Gray code-to-analog algorithm defined above in eq. (2.1). The initial analog signal $V_g(N+1)$ is defined as zero by connecting the first switch 24 to ground. Then, in each cycle of updating the intermediate signal $V_g(i)$, a reference signal Vr is subtracted from the previous intermediate signal $V_g(i+1)$, and the resulting signal is selectively, depending on the Gray code bit $b_g(i)$ applied in that cycle, subjected to a signal inversion and amplified by 0.5. The conversion continues until $V_g(1)$ has been generated.

It should be realized that alternatively, the amplifier 28 may be provided in front of the inverter 26 and the second switch 27.

It should also be understood that the cycles of the cyclic D/A-converter are somewhat separated in time from each other, and at the same time temporarily electrically isolated from each other. This line of operation is ensured by the sample/hold functionality and the control of the circuit by non-overlapping clock signals, as will be explained in more detail below with reference to FIGS. 5 and 6.

Figure 5:
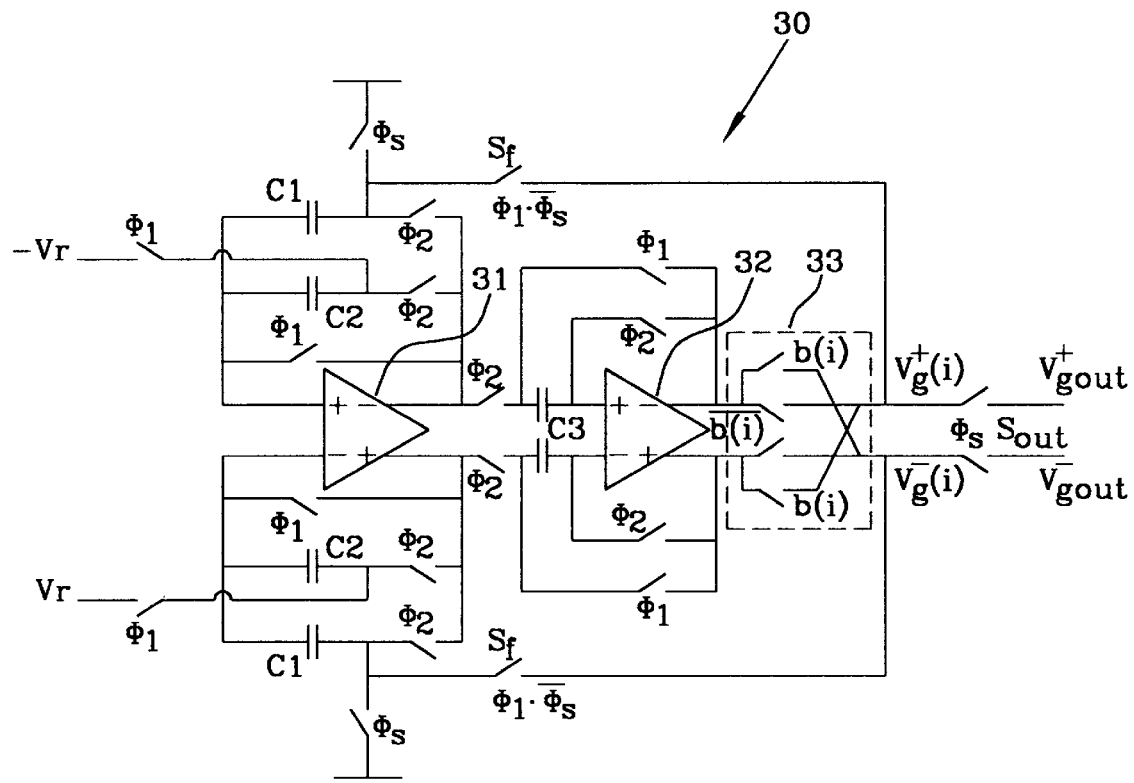
FIG. 5 is a circuit diagram of a fully differential realization of a cyclic D/A-converter in accordance with a first preferred embodiment of the invention.

FIG. 5 is a circuit diagram of an illustrative fully differential switched-capacitor realization of a cyclic D/A-converter in accordance with a first preferred embodiment of the invention. When dealing with fully differential realizations, dual signals, also referred to as differential signals, are considered. A differential signal has two signal parts of the same magnitude but opposite polarity. The circuit implementation of FIG. 5 realizes the Gray code-to-analog algorithm of eq. (2.1) with respect to differential signals. For reasons of simplicity, the differential signals will be referred to by the reference characters of the corresponding single-ended signals as they are defined in eq. (2.1).

Figure 6:
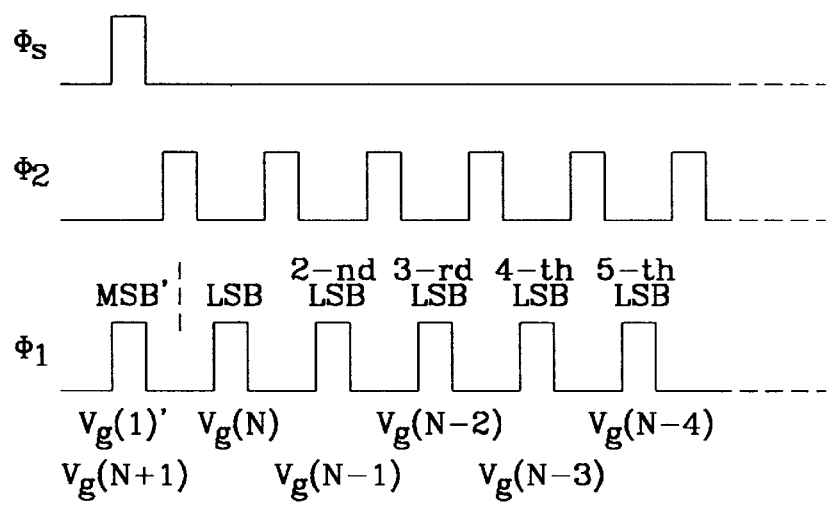
FIG. 6 is a timing diagram illustrating clock pulses that are utilized in the realization of FIG. 5.

The cyclic D/A-converter 30 basically comprises two operational amplifiers (OPAMPs) 31 and 32, capacitors C1, C2 and C3, a switch arrangement 33 and a number of control switches. Furthermore, there is also a digital input terminal (not shown) for successively receiving the Gray code bits, one Gray code bit for each cycle of the cyclic D/A-converter. The operational amplifier 31 and the capacitors C1 and C2 operate as a first sample-and-hold amplifier (SHA) under the control of appropriate control switches. The first SHA has a gain factor of 0.5 in its hold mode. The second operational amplifier 32 and the capacitors C3 operate as a second unity gain sample-and-hold amplifier (SHA) under the control of appropriate control switches. In addition to the control switches associated with the operation of the sample-and-hold amplifiers, there is also provided feedback switches $S_f$ and output switches $S_{out}$. The cyclic D/A-converter 30 further comprises a clock signal generator (not shown) which generates a set of clock signals $\Phi_s$, $\Phi_1$ and $\Phi_2$ of predetermined timing and predetermined signal values. FIG. 6 is a timing diagram illustrating the clock signals $\Phi_s$, $\Phi_1$ and $\Phi_2$ that are utilized in the D/A-converter realization of FIG. 5. The operation of the cyclic D/A-converter 30 is controlled by these clock signals in that the clock signals control the feedback switches $S_f$, the output switches $S_{out}$ and the control switches. The feedback switches $S_f$ are controlled by $\Phi_1 \cdot \Phi_s$, and the output switches $S_{out}$ are controlled by $\Phi_s$. In the figures, a specific control switch is referred to by the reference character of its corresponding clock signal. In this realization example, a switch is turned on when the corresponding clock signal goes high, and turned off when the corresponding clock signal goes low.

Referring to FIG. 5, each one of the OPAMPs 31, 32 has two input terminals and two output terminals, and operates with an internal common mode feedback function. The first OPAMP 31 has associated parallel capacitors C1, C2. There is a capacitor C1, and a capacitor C2 selectively connected, via control switches controlled by $\Phi_2$, in parallel over each pair of input-output (+ to −/− to +) terminals of the first OPAMP 31. The second OPAMP 32 has two associated front capacitors C3, each of which is connected to a respective one of the input terminals. The switch arrangement 33 has two input terminals and two output terminals and comprises four switches that are controlled by the input Gray code bit b(i), provided from the digital input terminal, and its logical inverse $\overline{b(i)}$. The switch arrangement 33 is configured to selectively, depending on the input Gray code bit, invert the differential signal input thereto by interchanging the signal polarities thereof. All capacitors has the same capacitance. The capacitors C1 are selectively connected, via control switches controlled by $\Phi_s$, to ground, and, via feedback switches Sf, to the output terminals of the switch arrangement 33. The capacitors C2 are selectively connected, via switches controlled by $\Phi_1$, to the inverse of the differential reference signal $V_r$, preferably supplied from a conventional signal source (not explicitly shown). In operation, when the first OPAMP 31 is in an amplify or hold phase, it will have a gain factor equal to 0.5. It should be understood that it is the first OPAMP 31 together with its associated capacitors C1 and C2, forming the first SHA, that give the arrangement the gain factor of 0.5. The first OPAMP 31 and the second OPAMP 32 have control switches controlled by $\Phi_1$ and $\Phi_2$, respectively, connected in parallel over the corresponding OPAMP. When closed, the control switches controlled by $\Phi_1$ and $\Phi_2$ short-circuit or reset the first OPAMP 31 and the second OPAMP 32, respectively- This reset enables suppression of the DC-offset in the OPAMPs. In addition, control switches controlled by $\Phi_1$ are connected in parallel over the second OPAMP 32 and its associated front capacitors C3.

It can be seen that the first SHA is selectively connected, via switches controlled by $\Phi_2$, to the second SHA, which in turn is directly connected to the switch arrangement 33. The output terminals of the switch arrangement 33 are connected to the output switches $S_{out}$, and selectively, via the feedback switches $S_f$, in a feedback line to the capacitors C1 of the first SHA.

Figure 7A:
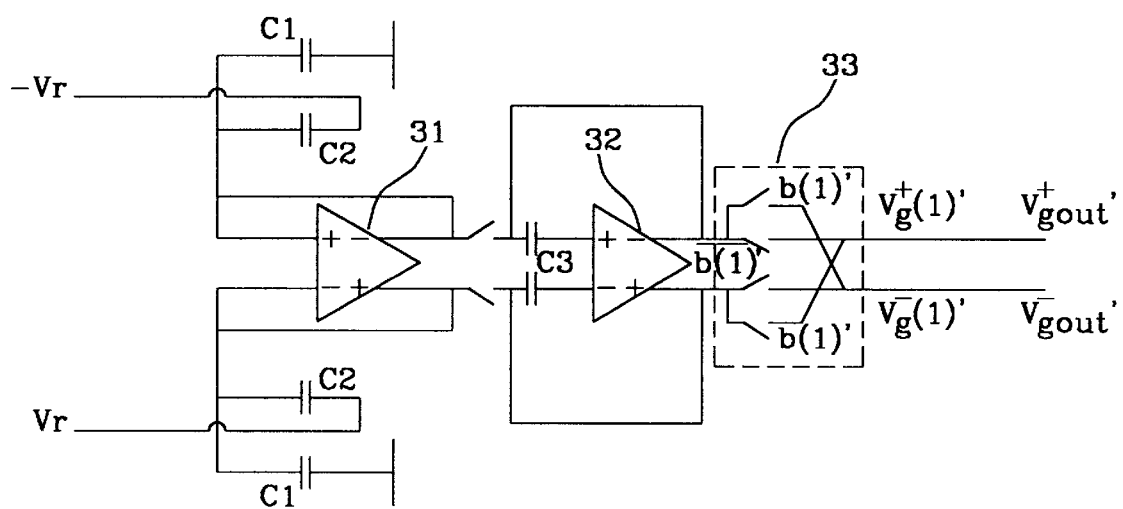
FIG. 7A–C are reduced circuit diagrams of the fully differential realization of FIG. 5 at different clock phases.
Figure 7B:
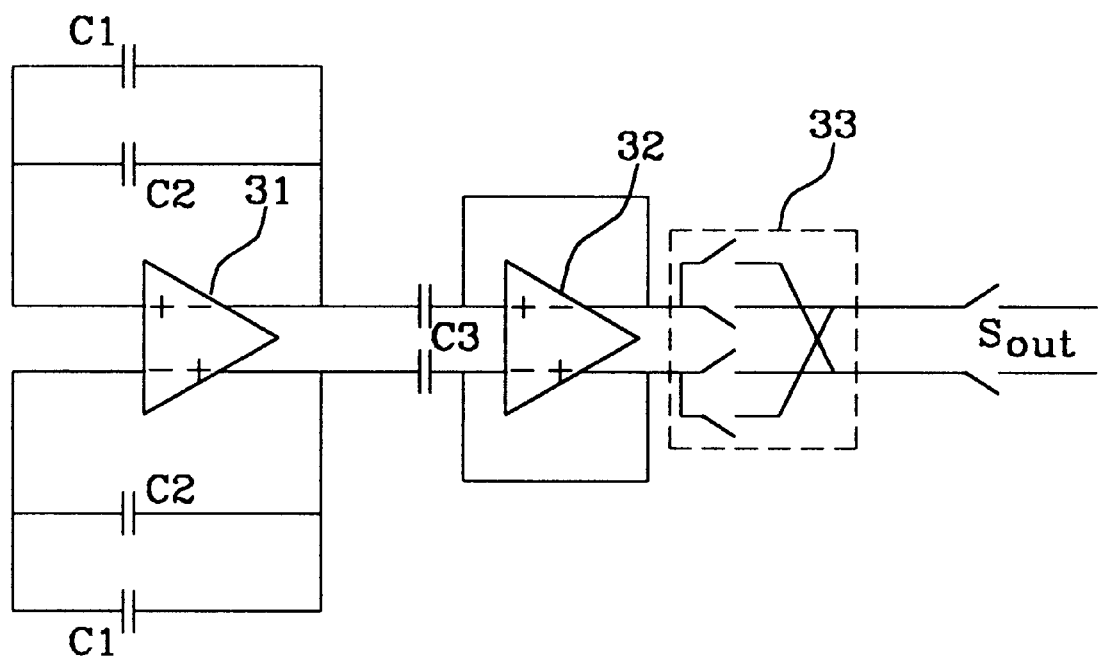
Figure 7C:
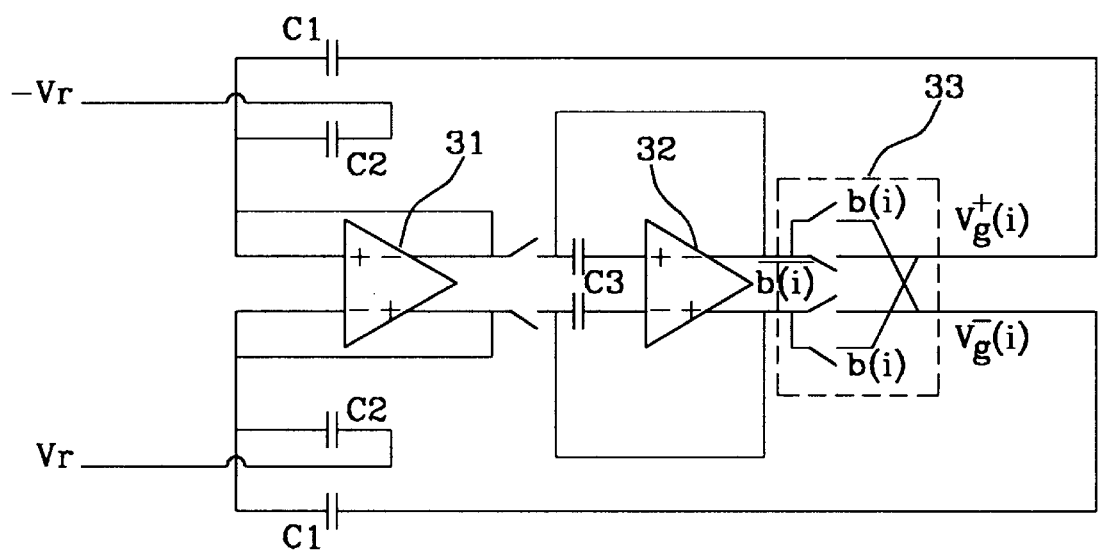

For a better understanding of the fully differential realization of the cyclic D/A-converter 30 shown in FIG. 5, the operation will now be explained in more detail at a number of consecutive clock phases, generally expressed in terms of high phases of the clock signals $\Phi_s$, $\Phi_1$ and $\Phi_2$. Reference will be made to FIGS. 7A–C which are reduced circuit diagrams of the fully differential realization of FIG. 5 at different clock phases. The circuit diagrams of FIGS. 7A–C have been reduced to illustrate only those parts of the cyclic D/A-converter 30 that are pertinent at the considered clock phase. Open switches and unconnected elements are generally not illustrated.

FIG. 7A illustrates the cyclic D/A-converter at the first clock phase, when $\Phi_s$ and $\Phi_1$ are high. A conversion starts on clock phase $\Phi_s$ which coincides with clock phase $\Phi_1$. The circuit is initialized by connecting the input capacitors C1 to ground such that a zero voltage is sampled onto capacitors C1, thus defining the initial analog signal $V_g(N+1)$. At the same time, the inverse of the reference signal is sampled onto the capacitors C2. Notice that due to the fully differential configuration, the reference (not the inverse of the reference) is sample by the negative branch. The first OPAMP 31 in the first SHA is auto-zeroed, and the second SHA, with the second OPAMP 32 and its associated capacitors C3, is in its hold mode. A Gray code input bit is applied to the switch arrangement 33 such that the voltage held by the second SHA is inverted or interchanged in dependence on the bit input. In the cyclic D/A-converter 30, a new D/A-conversion is initialized in the first clock phase. However, at the same time the most significant bit, referred to as MSB' in FIG. 6, of a previous digital input code is applied to the switch arrangement 33. Now, since $\Phi_s$ is high, the output switches $S_{out}$ are closed and the selectively inverted output signal of the switch arrangement 33 is forwarded as the analog output signal $V_{gout}'=V_g(1)'$ associated with the previous digital input code. The feedback from the output terminals of the switch arrangement 33 to the capacitors C1 of the first SHA is cut off by opening the feedback switches $S_f$, in order to prevent the previous D/A-conversion from effecting the new initialized D/A-conversion.

FIG. 7B illustrates the cyclic D/A-converter 30 at the second clock phase, when $\Phi_2$ is high. The first SHA is in its hold mode. Remember that the inverse of the reference was previously sampled onto the capacitors C2. Now, the charge on the capacitors C2 is distributed equally between the parallel capacitors C1 and C2, thus dividing the reference voltage by two (the first SHA realizes an amplification by 0.5). The output signal of the first SHA, i.e. the first OPAMP 31 and its associated capacitors C1 and C2, is sampled by the capacitors C3. Accordingly, the voltage sampled onto capacitors C3 is equal to $$\frac{1}{2} \cdot (-V_r).$$

The second OPAMP 32 in the second SHA is auto-zeroed and the output switches $S_{out}$ are now open.

FIG. 7C illustrates the cyclic D/A-converter 30 during the next clock phase, when $\Phi_1$ is high once again. As indicated in FIG. 6, the first Gray code input bit, the LSB, of the current digital input code, is applied to the circuit. Now, i=N. The second SHA is in its hold mode, and the signal held by the second SHA is passed to the switch arrangement 33 and selectively inverted thereby in dependence on the applied input bit b(N), the LSB. The output signal, also referred to as the intermediate analog signal $V_g(N)$, of the switch arrangement 33 is therefore equal to:

$$V_g(N) = \frac{1}{2} \cdot [-V_r + \Delta V(N)] \cdot (-1)^{b(N)} \qquad (3.1)$$

where $\Delta V(N)$ represents the error voltage in generating the intermediate signal $V_g(N)$. The error voltage $\Delta V(N)$ is assumed to represent all errors introduced to the signal during a conversion cycle, starting at $V_g(N+1)=0$ and ending at $V_g(N)$ defined above. This error voltage is representative of a number of different types of errors. Control switches provided at high impedance nodes normally inject a small charge, a so called clock induced charge, which gives rise to a DC-offset error voltage. In a differential realization, these offset errors will ideally exclude each other. However, switch pairs that are asymmetric with regard to clock induced charge injection will generate a DC-off set. In general, there is also a DC-offset inherent in each OPAMP, although this offset voltage is minimized by resetting the OPAMPs. In the following, all errors together, including low-frequency noise as well, produced in a cycle generating the intermediate signal $V_g(i)$, are represented by the error voltage $\Delta V(i)$.

The output switches $S_{out}$ are still open, but now, the feedback switches $S_f$ are closed such that the intermediate signal $V_g(N)$ from the switch arrangement 33 is sampled onto the capacitors C1. At the same time, the inverse of the reference signal is sampled onto the capacitors C2, and the first OPAMP 31 in the first SHA is auto-zeroed.

In the next clock phase, when $\Phi_2$ is high (see FIG. 7B once again), the first SHA is in its hold mode. During the preceding clock phase (see FIG. 7C) the intermediate signal $V_g(N)$ was sampled onto the capacitors C1 and the inverse of the reference was sampled onto the capacitors C2. Now, the sum of the charges on the capacitors C1 and C2 is distributed equally between capacitors C1 and C2. In other words, the first SHA realizes an amplification by 0.5. The output signal of the first SHA, i.e. the first OPAMP 31 and its associated capacitors C1 and C2, is sampled by the capacitors C3. Accordingly, the voltage sampled onto capacitors C3 is equal to $$\frac{1}{2} \cdot [V_g(N) - V_r].$$

The second OPAMP 32 in the second SHA is auto-zeroed, and the output switches $S_{out}$ are open.

Next, on clock phase $\Phi_1$, as indicated in FIG. 6, the second Gray code input bit, the 2-nd LSB, of the current digital input code, is applied to the circuit- Referring once again to FIG. 7C, with i=N−1, the second SHA is in its hold mode, and the signal held by the second SHA is passed to the switch arrangement 33 and selectively inverted thereby in dependence on the applied input bit b(N−1), the 2-nd LSB. The output signal, also referred to as the intermediate analog signal $V_g(N−1)$, of the switch arrangement 33 is therefore equal to:

$$V_g(N-1) = \frac{1}{2} \cdot (V_g(N) - V_r + \Delta V(N-1)) \cdot (-1)^{b(N-1)} \quad (3.2)$$

where $\Delta V(N−1)$ represents the error in generating the intermediate signal $V_g(N−1)$. The output switches $S_{out}$ are still open, and the feedback switches $S_f$ are closed such that the intermediate signal $V_g(N−1)$ from the switch arrangement 33 is sampled onto the capacitors C1. The inverse of the reference signal is sampled onto the capacitors C2. In addition, the first OPAMP 31 in the first SHA is auto-zeroed.

In the next clock phase, when $\Phi_2$ is high (see FIG. 7B), the first SHA is in its hold mode. During the preceding clock phase, the intermediate signal $V_g(N−1)$ was sampled onto the capacitors C1 and the inverse of the reference was sampled onto the capacitors C2. Now, the sum of the charges on the capacitors C1 and C2 is distributed equally between capacitors C1 and C2, and the output signal of the first SHA is sampled by the capacitors C3. Accordingly, the voltage sampled onto capacitors C3 is equal to $$\frac{1}{2} \cdot [V_g(N-1) - V_r].$$

The second OPAMP 32 in the second SHA is auto-zeroed, and the output switches $S_{out}$ are still open.

The operation of the cyclic D/A-converter continues, alternating between the circuit configuration of FIG. 7C at clock phase $\Phi_1$ and the circuit configuration of FIG. 7B at clock phase $\Phi_2$, until the MSB of the current digital input code is applied to the D/A-converter. The following relationship (identical to eq. 2.7) holds true in generating the intermediate signal $V_g(i)$:

$$V_g(i) = \frac{1}{2} \cdot [V_g(i+1) - V_r + \Delta V(i)] \cdot (-1)^{b(i)}. \quad (3.3)$$

At the time when the MSB of the current input code is applied to the circuit, the reset clock signal $\Phi_s$ is active, coinciding with clock phase $\Phi_1$. The MSB input determines whether or not the switch arrangement 33 inverts the signal held by the second SHA. Now, the output switches are closed, forwarding the selectively inverted output signal of the switch arrangement 33 as the analog output signal $V_{gout}=V_g(1)$ associated with the current digital input code. The analog output signal is defined as:

$$V_{gout} = V_g(1) = \frac{1}{2} \cdot [V_g(2) - V_r + \Delta V(1)] \cdot (-1)^{b(1)} = \quad (3.4)$$

$$-\left\{\sum_{i=1}^{N} \frac{1}{2^i} (-1)^{\sum_{j=1}^{i} b(j)}\right\} \cdot V_r + \sum_{i=1}^{N} \left\{\frac{1}{2^i} \cdot (-1)^{\sum_{j=1}^{i} b(j)} \cdot \Delta V(i)\right\}.$$

The last term of $V_{gout}$ represents the total accumulated error in the final analog output signal. The feedback from the switch arrangement 33 to the capacitors C1 of the first SHA is cut off by opening the feedback switches $S_f$, thus preventing the current D/A-conversion from effecting a following D/A-conversion. The fact that the control switches controlled by $\Phi_2$ between the first SHA and the second SHA are open, makes it possible to initialize a further D/A-conversion at the same time as the current D/A-conversion is being completed. The initialization of the circuit is performed by connecting the input capacitors C1 to ground such that a zero voltage is sampled onto capacitors C1. At the same time, the inverse of the reference signal is sampled onto the capacitors C2, and the first OPAMP 31 in the first SHA is auto-zeroed.

A D/A-conversion using the N-bit cyclic D/A-converter according to FIG. 5, takes N clock cycles.

It should be understood that the signal inversion executed in the switch arrangement 33 utilizes the digital information of the bit input, and decides whether or not the input signal to the switch arrangement 33 should be inverted based on this information. The signal inversion is preferably implemented as a digitally controlled polarity shift. In the fully differential realization of FIG. 5 the inversion is performed by interchanging the polarity of the differential signal by using the digitally controlled switch arrangement 33. In this way, the signal inversion is realized with very high accuracy. The high precision of the signal inversion further improves the accuracy of the cyclic D/A-converter according to the invention.

In addition, since the signal inversion only requires very simple clock controlled switches, the hardware overhead is kept to a minimum.

It is possible to modify the fully differential circuit realization described above in connection with FIGS. 5, 6 and 7A–C by changing the specific configuration of the switches and capacitors. The number of switches and capacitors may be altered.

The sample-and-hold functionalities, the amplification by 0.5, as well as the inversion are also possible to realize in alternative forms. The clock signals that control the switches and circuits of the cyclic D/A-converter will of course be adjusted in accordance with these modifications of the circuit realization.

It should also be understood that single-ended D/A-converter realizations based on the fully differential realization of FIG. 5 are easily obtained.

Figure 8:
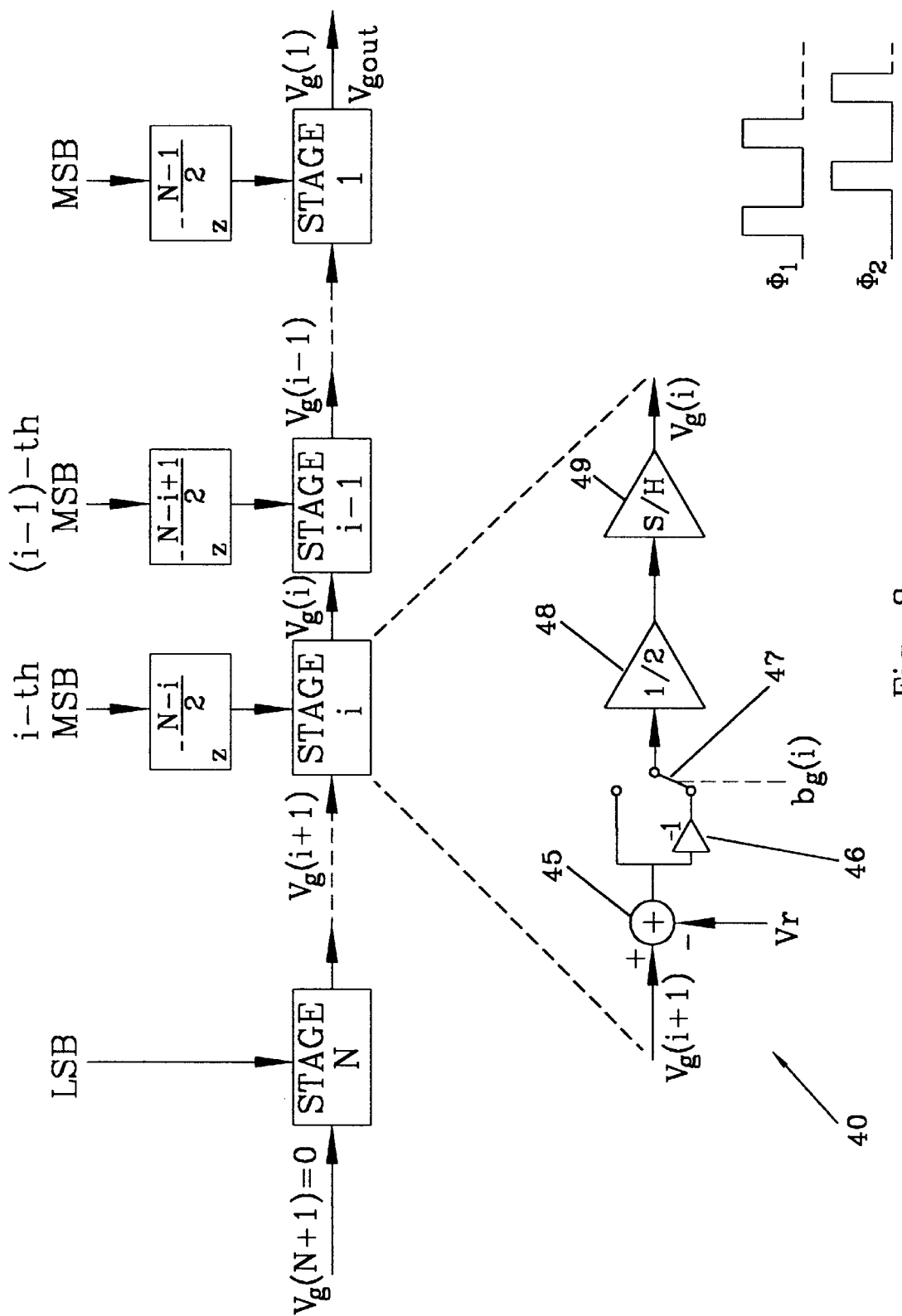
FIG. 8 is a schematic block diagram illustrating the basic principle of a pipeline D/A-converter according to the invention.

Implementations of the inventive Gray code-to-analog algorithm into pipeline D/A-converters FIG. 8 is a schematic block diagram illustrating the basic principle of a pipeline D/A-converter according to the invention. The pipeline D/A-converter according to the invention is a discrete-time N-bit D/A-converter which comprises an integer number, N, of signal processing stages that are connected in cascade (in series). Accordingly, the digital input signal comprises N Gray code input bits $b_g(i)$, where i goes from N to 1. Note that $b_g(N)$ designates the least significant bit (LSB) and $b_g(1)$ the most significant bit (MSB). For illustrative purposes, all stages are not shown explicitly. In general, each stage has an analog input terminal, an analog output terminal and a digital input terminal. The analog output terminal of a stage is connected to the analog input terminal of the following stage. The digital input terminal of each stage is responsive to a respective one of the input bits $b_g(i)$, also referred to as the i-th MSB, of the digital input signal. Furthermore, there is also provided a second analog input terminal that is responsive to a predetermined reference signal.

The actual pipeline D/A-conversion starts by connecting stage N to ground, thus defining an initial analog signal $V_g(N+1)$ which is equal to zero. Next, the digital input code is applied to the D/A-converter, and the input bits $b_g(i)$ of the code word are successively applied to the signal processing stages of the converter, one bit for each stage, in a discrete-time sequence, and an intermediate analog signal $V_g(i)$ is updated by the stages of the converter in a pipelined manner until a final analog output signal $V_g(1)=V_{gout}$ is generated in the last stage. By definition, when the last stage has generated its analog output signal $V_g(1)$, the D/A-conversion is completed.

The signal processing stages of the pipeline D/A-converter are typically controlled by non-overlapping clock signals, such as $\Phi_1$ and $\Phi_2$ shown in FIG. 8, in combination with some sort of sample-and-hold circuitry provided in each stage. This ensures discrete-time operation of the converter. The input bits are preferably applied with a separation of half a clock cycle between successive bits. In other words, the operation of the stages of the pipeline D/A-converter are somewhat separated in time from each other, as well as temporarily electrically isolated from each other. If, as an example, stage i receives the i-th MSB to generate the intermediate analog signal $V_g(i)$ on clock phase $\Phi_2$, then stage (i−1) receives the (i−1)-th LSB to generate the intermediate analog signal $V_g(i-1)$ on clock phase $\Phi_1$ and so on. These clock signals are generated by a conventional clock signal generator (not shown).

In FIG. 8 there is also illustrated a more detailed representation of a single stage 40 of the inventive pipeline D/A-converter. The pipeline stage 40 of FIG. 8 basically comprises the following functional components: an adder/subtractor 45, an inverter 46, a switch 47, an amplifier 48 with a gain factor equal to 0.5, and a sample/hold circuit 49. The pipeline stage 40 operates as follows: The output terminal of the preceding stage is connected to the adder/subtractor 45 which receives, in a given clock phase, the intermediate analog signal $V_g(i+1)$ of the previous stage. The adder/subtractor 45 is also responsive to a reference signal Vr which is subtracted from the intermediate analog signal $V_g(i+1)$. The Gray code input bit, in this case $b_g(i)$, applied to the pipeline stage 40 determines whether the output signal of the adder/subtractor 45 or its inverse is fed forward. The signal inversion is carried out by the signal inverter 46. The switch 47 is controlled by the applied Gray code bit such that either the output signal of the adder/subtractor 45 or its inverse will be switched into connection with the amplifier 48. The amplifier 48 amplifies the forwarded signal by a factor of 0.5. The amplified signal is sampled and held by the sample/hold circuit 49. The sampled and held signal of the S/H-circuit 49 is defined as an intermediate analog signal $V_g(i)$ associated with the input bit $b_g(i)$. In the next clock phase, the intermediate signal $V_g(i)$ sampled and held by the sample/hold circuit 49, is released and passed to the following stage (stage i−1).

It should be understood that the pipeline D/A-converter of FIG. 8 is a direct realization of the inventive Gray code-to-analog algorithm defined above in eq. (2.1). However, the amplifier 48 may alternatively be provided in front of the inverter 46 and the switch 47. In addition, the amplifier 48 and the S/H-circuit 49 may be integrated into a single unit such as a sample-and-hold amplifier.

In order to fully utilize the high speed capacity of the pipeline D/A-converter according to the invention, the converter normally performs a number of D/A-conversions "simultaneously". Once a signal processing stage has updated the intermediate analog signal in response to the input bit of a first digital code value, and transferred the intermediate signal to the next stage, it is ready to receive an input bit of a second digital code value. In this way, the pipeline D/A-converter may simultaneously process input bits of different digital code values in different stages of the converter. This line of operation increases the throughput of the converter so that the pipeline DAC generates an analog output signal every clock cycle.

Figure 9:
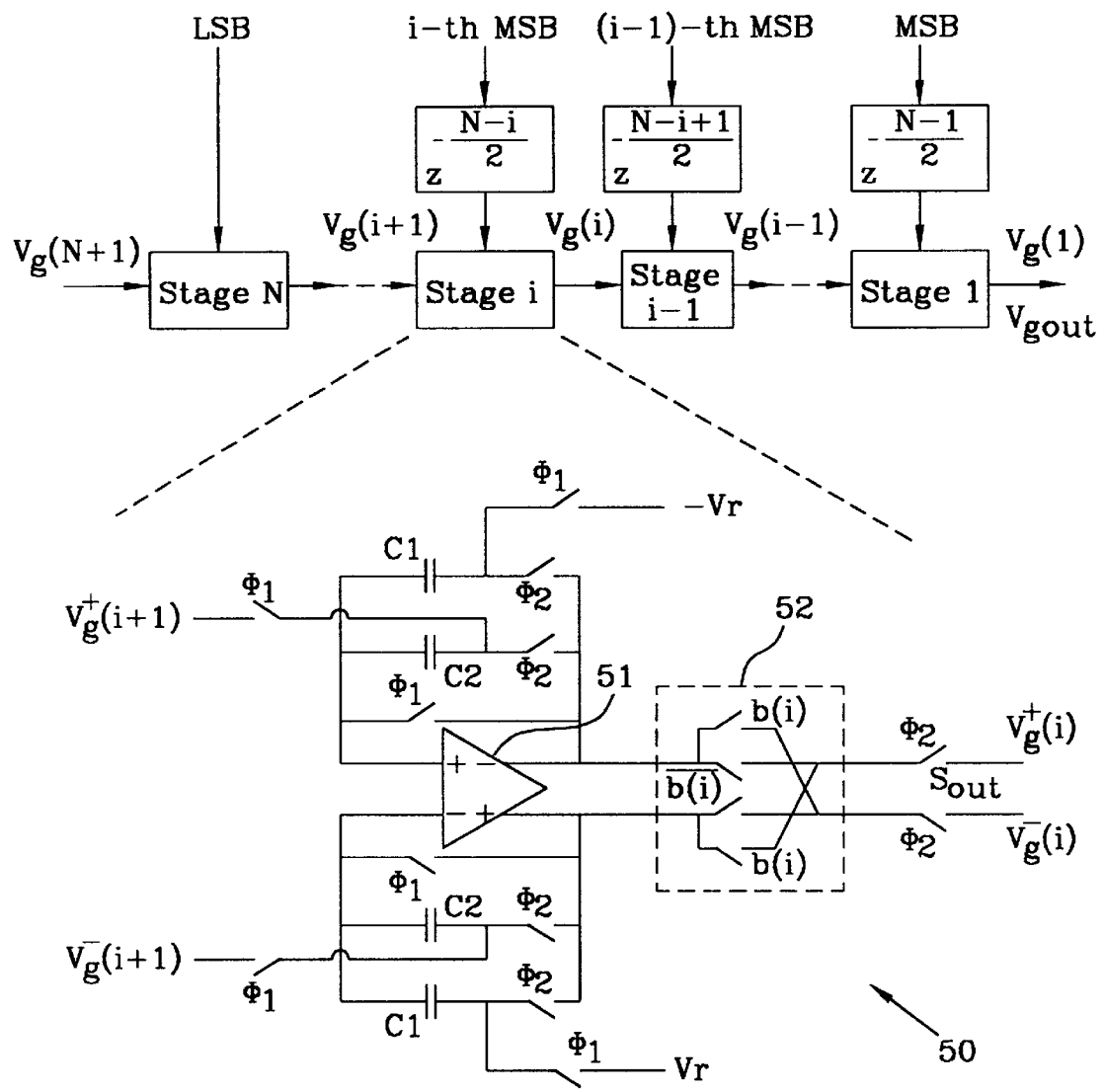
FIG. 9 is a circuit diagram of a fully differential realization of a pipeline D/A-converter in accordance with a second preferred embodiment of the invention.

FIG. 9 is a circuit diagram of a fully differential pipeline D/A-converter in accordance with a second preferred embodiment of the invention. The overall structure of the pipeline D/A-converter of FIG. 9 is very similar to that of FIG. 8. The pipeline D/A-converter of FIG. 9 comprises an integer number, N, of cascaded signal processing stages, in which the analog output terminal of one stage is connected to the analog input terminal of the following stage. The digital input signal comprises N Gray code input bits $b_g(i)$, where i goes from N to 1, and $b_g(N)$ designates the least significant bit (LSB) and $b_g(1)$ the most significant bit (MSB). The actual pipeline D/A-conversion starts by connecting stage N to ground, thus defining an initial analog signal $V_g(N+1)$ which is equal to zero. Next, the digital input code is applied to the converter, and the input bits $b_g(i)$ of the digital input code are successively applied to the individual signal processing stages of the converter, one bit for each stage, in a discrete-time sequence, and an intermediate analog signal $V_g(i)$ is successively updated by the signal processing stages of the converter in a pipelined manner until a final analog output signal $V_g(1)=V_{gout}$ is generated in the last stage.

Figure 10:
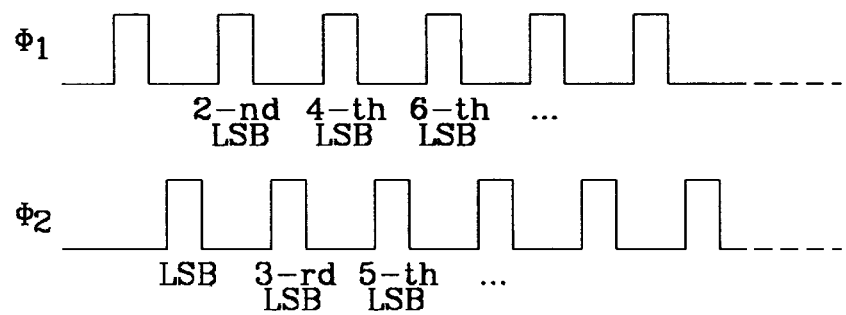
FIG. 10 is a timing diagram illustrating clock pulses that are utilized in the realization of FIG. 9.

The pipeline D/A-converter of FIG. 9 also comprises a clock signal generator (not shown) for generating a set of clock signals $\Phi_1$ and $\Phi_2$ of predetermined timing and predetermined signal values. FIG. 10 is a timing diagram illustrating the clock signals $\Phi_1$ and $\Phi_2$, which control the operation of the pipeline D/A-converter.

In order to process the digital input code properly, there is provided a delay of half a clock cycle between successive input bits, starting from the LSB. The notation $$z^{-\frac{N-i}{2}}$$

indicates a delay by $$\frac{N-i}{2}$$

clock cycles (N>i>1). Furthermore, the clock phases between successive stages should be "interchanged", i.e. if stage i generates the intermediate analog signal $V_g(i)$ on clock phase $\Phi_2$, then stage (i−1) generates the intermediate analog signal $V_g(i-1)$ on clock phase $\Phi_1$.

In FIG. 9 there is also illustrated a more detailed representation of a single pipeline stage 50. The pipeline stage 50 is a fully differential realization. When dealing with fully differential realizations, differential signals are considered. The pipeline D/A-converter according to FIG. 9 is based on the Gray code-to-analog algorithm of eq. (2.1) with respect to differential signals. For reasons of simplicity, the differential signals will be-referred to by the reference characters of the corresponding single-ended signals.

The pipeline stage 50 of FIG. 9 will now be described in detail. It basically comprises the following functional components: an operational amplifier (OPAMP) 51, capacitors C1 and C2, a switch arrangement 52, a number of control switches and output switches $S_{out}$. The output switches $S_{out}$ are controlled by $\Phi_2$. The operational amplifier 51 and the capacitors C1 and C2 operate as a sample-and-hold amplifier (SHA) under the control of appropriate control switches. In the figures, a specific control switch is referred to by the reference character of its corresponding clock signal. In this realization example, a switch is turned on when the corresponding clock signal goes high, and turned off when the corresponding clock signal goes low.

The OPAMP 51 has two input terminals and two output terminals, and operates with an internal common mode feedback function. Furthermore, the OPAMP 51 has associated parallel capacitors C1 and C2. There is a capacitor C1, and a capacitor C2 selectively connected, via control switches controlled by $\Phi_2$, in parallel over each pair of input-output terminals of the OPAMP 51. In addition, the OPAMP 51 has control switches controlled by $\Phi_1$ in parallel over the OPAMP. When closed, these control switches controlled by $\Phi_1$ short-circuit or reset the OPAMP 51. This reset enables suppression of the DC-offset in the OPAMP 51. All capacitors has the same capacitance. The capacitors C1 are selectively connected, via switches controlled by $\Phi_1$, to the inverse of the differential reference signal $V_r$. The reference signal is preferably supplied via a second analog input terminal from a conventional signal source. The capacitors C2 are selectively connected, via switches controlled by $\Phi_1$, to the output terminals of the preceding stage, thus ready to receive the intermediate signal $V_g(i+1)$. In operation, when the SHA, i.e. the OPAMP 51 together with its associated capacitors C1 and C2, is in its amplify or hold phase, it will have a gain factor equal to 0.5. The switch arrangement 52 has two input terminals and two output terminals and comprises four switches that are controlled by the input Gray code bit b(i) and its logical inverse $\overline{b(i)}$. The switch arrangement 52 is configured to selectively, depending on the Gray code input bit, invert the differential signal that is input thereto by interchanging the signal polarities of this differential signal.

The SHA is connected to receive the intermediate signal $V_g(i+1)$ from the preceding stage, and the inverse of the predetermined reference signal. In its hold phase, the SHA realizes an amplification by 0.5. The SHA is also connected directly to the switch arrangement 52 which selectively inverts the output signal of the SHA. The selectively inverted signal of the switch arrangement is passed as the intermediate signal $V_g(i)$ to the next stage.

Figure 11A:
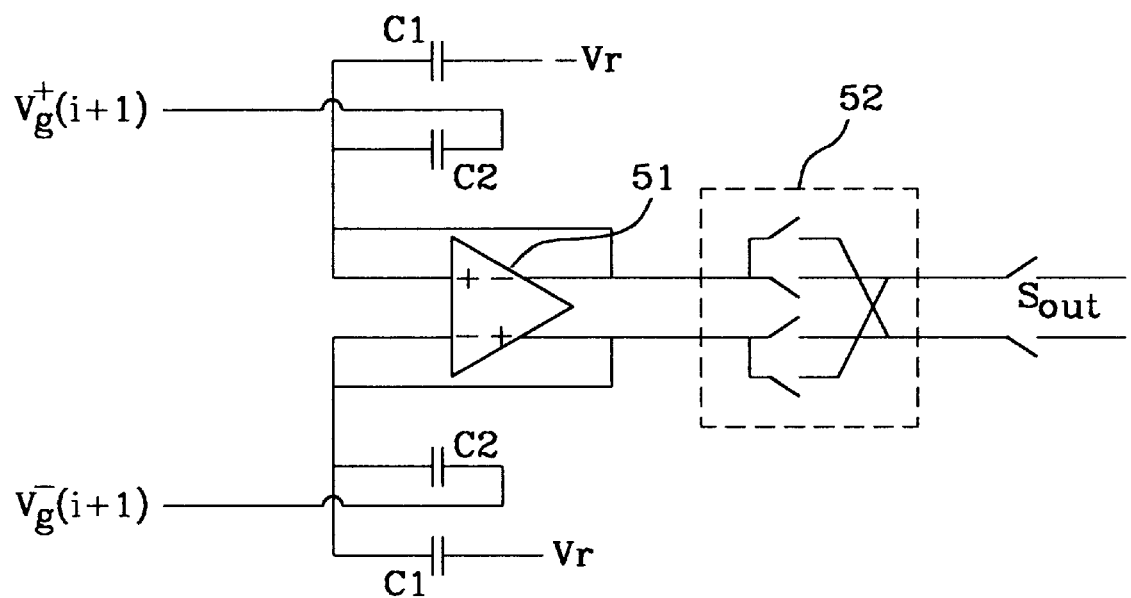
FIG. 11A–B are reduced circuit diagrams of the fully differential pipeline stage, shown in FIG. 9, at different clock phases.
Figure 11B:
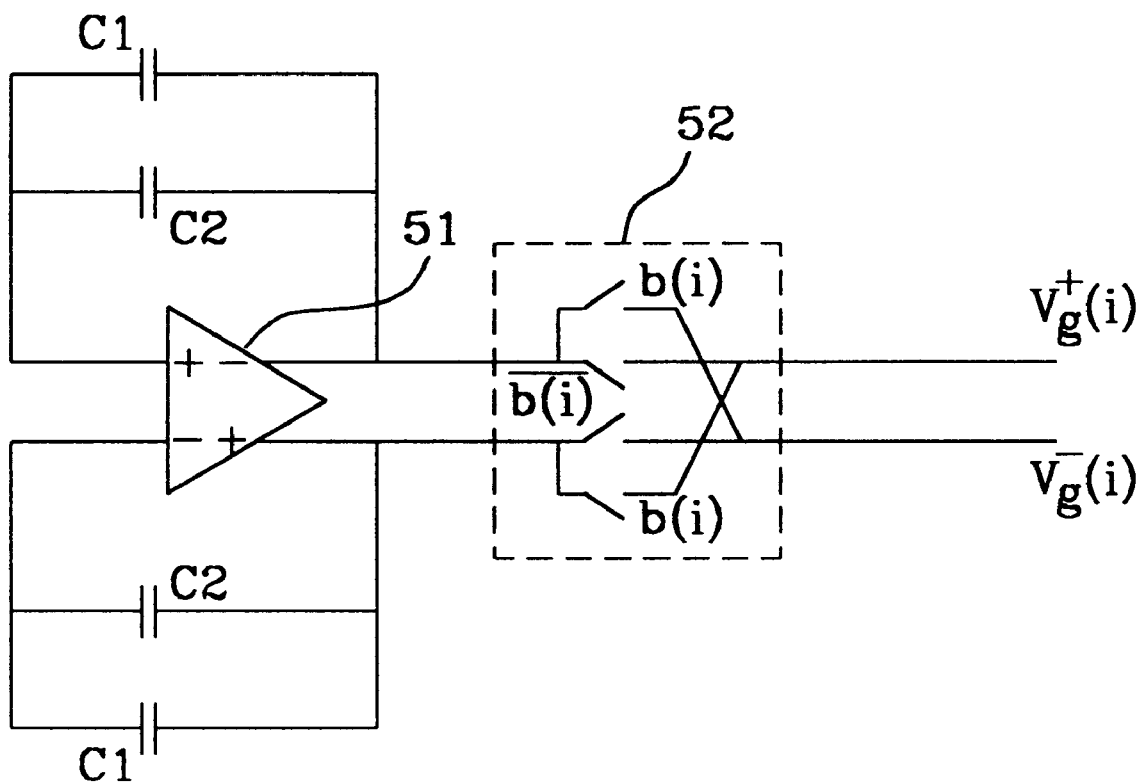

For a better understanding of the fully differential realization of FIG. 9, the operation of the pipeline stage 50 will now be explained at consecutive clock phases, generally expressed in terms of high phases of the clock signals $\Phi_1$ and $\Phi_2$. Reference will now be made to FIGS. 11A–B which are reduced circuit diagrams of the fully differential pipeline stage 50 of FIG. 9, at different clock phases. The circuit diagrams of FIGS. 11A–B have been reduced to illustrate only those parts of the pipeline D/A-converter stage 50 that are pertinent at the considered clock phase. Open switches and unconnected elements are generally not illustrated.

FIG. 11A illustrates the pipeline D/A-converter stage 50 at the clock phase when $\Phi_1$ is high. The input capacitors C2 are connected to the output terminals of the preceding stage such as to sample the intermediate signal $V_g(i+1)$. Also, the inverse of the reference signal $V_r$ is sampled onto the capacitors C1. Notice that due to the fully differential configuration, the reference (not the inverse of the reference) is sample by the negative branch. The OPAMP 51 in the SHA is auto-zeroed.

FIG. 11B illustrates the cyclic D/A-converter 30 at the clock phase when $\Phi_2$ is high. Now, the sum of the charges on the capacitors C1 and C2 is distributed equally between capacitors C1 and C2, thus dividing the sum of these charges by two. In other words, the SHA realizes an amplification by 0.5. The output signal of the SHA, i.e. the OPAMP 51 and its associated capacitors C1 and C2, is equal to $$\frac{1}{2} \cdot [V_g(i+1) - V_r + \Delta V(i)],$$

where $\Delta V(i)$ represents the error in generating the intermediate signal $V_g(i)$. For simplicity, it is assumed that this error voltage is introduced at the OPAMP 51. The error voltage $\Delta V(i)$ is representative of a number of different types of errors such as clock induced charge injections and other DC-offsets, as well as low-frequency noise. The error produced in a particular stage is not necessarily identical to that of the other stages. It is however assumed that part of the error is correlated and that part is uncorrelated, such that $\Delta V(i) = \Delta V_s + \Delta V_r(i)$, where $\Delta V_s$ is a systematic error that is identical to all stages, and $\Delta V_r(i)$ is a random error that is individual for each stage. The systematic error $\Delta V_s$ may of course vary between different D/A-converters. The random error $\Delta V_r(i)$ has an expectance value equal to zero. In the following, for reasons of simplicity, it is assumed that the effect of random errors on the D/A-conversion will be zero, and therefore $\Delta V(i) = \Delta V_s$. The output signal of the SHA, including the systematic error $\Delta V_s$, is received by the switch arrangement 52. The Gray code input bit b(i) and its inverse $$\overline{b(i)}$$

are applied to the switch arrangement 52, and the switch arrangement 52 inverts or interchanges the differential signal held by the SHA, in dependence on the applied input bit as indicated in FIG. 11B. The output switches $S_{out}$ are closed and the selectively inverted output signal of the switch arrangement 52 is forwarded to the next stage as the intermediate signal $V_g(i)$. The intermediate signal $V_g(i)$ is equal to:

$$V_g(i) = \frac{1}{2} \cdot [V_g(i+1) - V_r + \Delta V_s] \cdot (-1)^{b(i)}. \quad (4.1)$$

To realize a complete N-bit D/A-conversion, all N stages are utilized, and the output signal $V_g(1)$ of the last stage, i.e. stage 1, is given by:

$$V_g(1) = \frac{1}{2} \cdot [V_g(2) - V_r + \Delta V_s] \cdot (-1)^{b(1)} = \quad (4.2)$$

$$-\left\{ \sum_{i=1}^{N} \frac{1}{2^i} (-1)^{\sum_{j=1}^{i} b(j)} \right\} \cdot V_r + \sum_{i=1}^{N} \left\{ \frac{1}{2^i} \cdot (-1)^{\sum_{j=1}^{i} b(j)} \cdot \Delta V_s \right\}.$$

As mentioned above, the output signal $V_g(1)$ of the last stage is defined as the final analog output signal associated with the digital input code. The last term in eq. (4.2) represents the total accumulated error in the final analog output signal.

The total accumulated error for the fully differential N-bit pipeline D/A-converter of FIG. 9 is consistent with the total accumulated error for the fully differential N-bit cyclic D/A-converter of FIG. 5, and also with the accumulated error given by eq. (2.9).

Of course, single-ended pipeline D/A-converter realizations based on the fully differential pipeline realization described above in connection with FIGS. 9, 10 and 11A–B, are easily obtained.

It is important to understand that hybrids of cyclic and pipeline D/A-converters are possible. In an alternative embodiment of the present invention, k cyclic m-bit D/A- converters are connected in series to form a hybrid D/A-converter of k times m bits, where k and m are positive integers. By way of example, four 2-bit cyclic D/A-converters according to the invention are cascaded in a pipelined manner to form an 8-bit D/A-converter.

Figure 12:
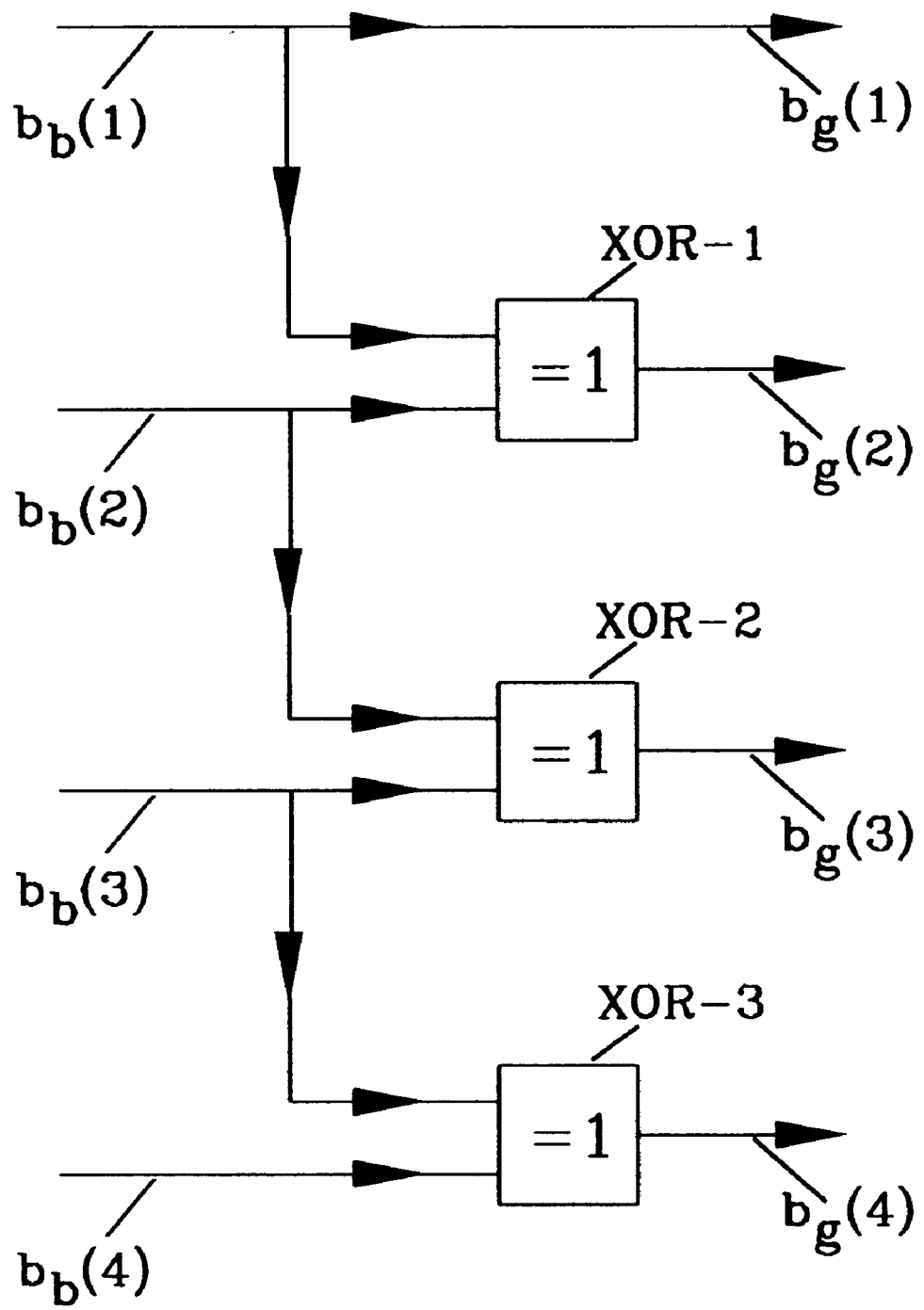
FIG. 12 is a schematic diagram illustrating the transformation of bits of binary code into Gray code bits.

Naturally, the digital input signal to a Gray code-to-analog D/A-converter according to the invention is in the form of Gray code. However, if the D/A-converter according to the invention is to be used in a system having equipment designed to work with regular binary code, it is necessary to convert the binary code signals into signals of Gray code. Consequently, in this case, the inventive D/A-converter further incorporates, as an input stage, means for digitally transforming or converting a signal of regular binary code into a Gray coded input signal. FIG. 12 is a schematic diagram illustrating an illustrative transformation of 4 bits of regular binary code into 4 bits of Gray code by using simple digital gates XOR-1, XOR-2, XOR-3. Bits, here denoted $b_b(i)$, of regular binary code are transformed into Gray code bits, here denoted $b_g(i)$, according to following relation which is identical to eq. (2.3) above:

$$b_g(1) = b_b(1);$$
$$b_g(i) = b_b(i) \oplus b_b(i-1), (2 \leq i \leq N) \quad (4.3)$$

where N is the number of bits of the code values, and $\oplus$ denotes the exclusive OR operation. In the example of FIG. 12, N is equal to 4. The binary code MSB, $b_b(1)$, transforms into the Gray code MSB, $b_g(1)$, without any change. The remaining binary code bits are transformed into Gray code bits by using the corresponding digital XOR-gates. This digital transformation does not introduce any offset errors. Accordingly, by using the above digital binary code-to-Gray code transformation in combination with a Gray code-to-analog D/A-conversion according to the invention, it is possible to perform a D/A-conversion of an input signal initially given in binary code, and still obtain an analog output signal with a low level of accumulated of offset errors.

Alternative implementation of a cyclic D/A-converter

Figure 13:
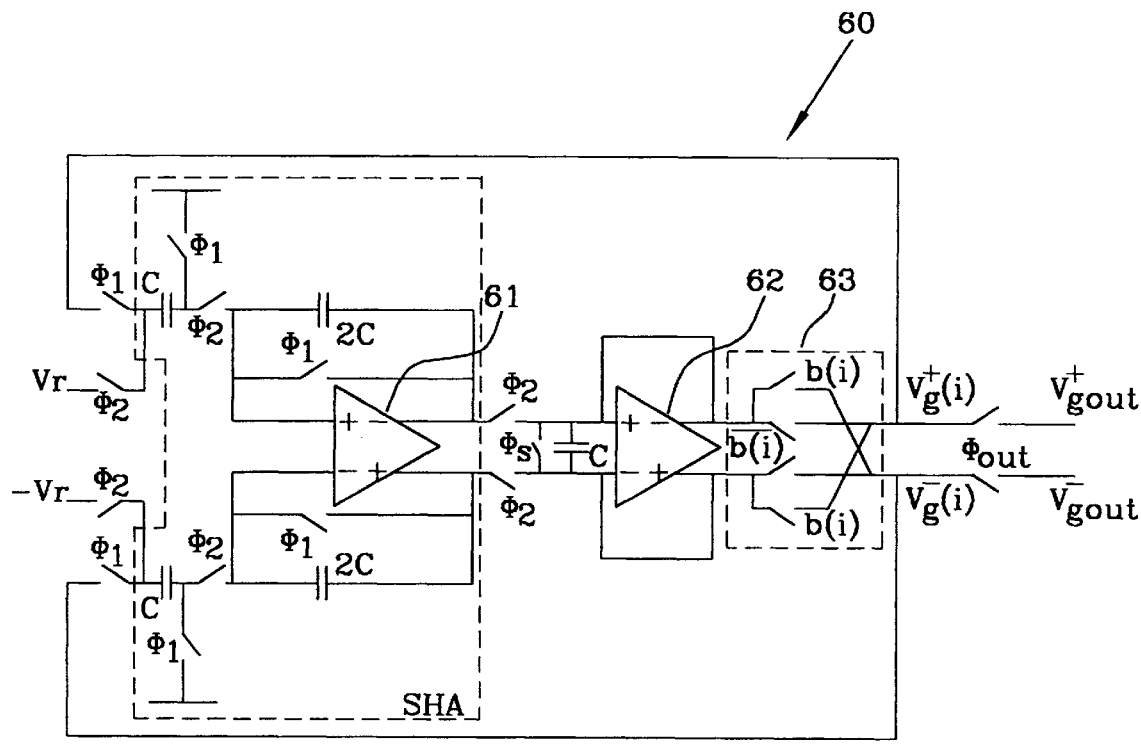
FIG. 13 is a circuit diagram of an illustrative fully differential realization of a cyclic D/A-converter in accordance with an alternative embodiment of the invention.

FIG. 13 is a circuit diagram of an illustrative fully differential switched-capacitor realization of a cyclic D/A-converter in accordance with an alternative embodiment of the invention. The circuit implementation of FIG. 13 realizes the Gray code-to-analog algorithm of eq. (2.1) with respect to differential signals. Just as the realization of FIG. 5, the realization of FIG. 13 is of switched-capacitor type with digitally controlled switches. In a D/A-conversion, a subtraction of the reference and an amplification by a factor of 0.5 are performed. It should also be understood that the Gray code bits of the digital signal determines whether or not the inverse function of the algorithm is realized.

The cyclic D/A-converter 60 basically comprises a first operational amplifier (OPAMP) 61, a second operational amplifier 62, a switch arrangement 63, associated capacitors (C, 2C), a number of control switches and a pair of output switches.

Each one of the OPAMPs 61, 62 has two input terminals and two output terminals, and operates with an internal common mode feedback function.

In FIG. 13, the sample-and-hold circuitry which comprises the operational amplifier 61, the associated capacitors C and 2C, the ground connection and the control switches $\Phi_1$ and $\Phi_2$ is defined as a sample-and-hold amplifier, encircled by dotted lines and indicated in the figure as SHA. The sample-and-hold amplifier (SHA) has a gain factor of 0.5 in its hold mode. Each one of the capacitors 2C (with a capacitance 2 times that of the capacitors C) is connected in parallel over a respective pair of input-output (of opposite signs) terminals of the first operational amplifier 61. Each one of the capacitors (C) is selectively connected, via a respective switch $\Phi_2$, to a respective input terminal of said first operational amplifier 61, and the capacitors (C) are selectively responsive, via respective switches $\Phi_2$, to the differential reference signal Vr and, via respective feedback switches $\Phi_1$, to a differential feedback signal. There are switches $\Phi_1$ connected in parallel (in the same manner as the capacitors 2C) over the first operational amplifier (61) for selectively resetting it.

The second OPAMP 62 with its capacitor (C) is configured as a sample-and-hold circuit (SHC) acting as a unity gain buffer. There are connections between each pair of input-output (+ to −/− to +) terminals, and the associated capacitor (C) is connected over the input terminals of the second operational amplifier 62.

The sample-and-hold circuit SHC is selectively connected, via switches $\Phi_2$, to the output terminals of said first operational amplifier 61 for sampling the amplified differential output signal of the sample-and-hold amplifier SHA.

Furthermore, there is also a digital input terminal (not shown) for successively receiving the Gray code bits, one Gray code bit for each cycle of the cyclic D/A-converter.

The switch arrangement 63 has two input terminals and two output terminals and comprises four switches that are controlled by the input Gray code bit b(i), provided from the digital input terminal, and its logical inverse $\overline{b(i)}$. The switch arrangement 63 is configured to selectively, depending on the input Gray code bit, invert the differential output signal of said sample-and-hold circuit SHC by interchanging the signal polarities of the signal. The selectively interchanged/inverted differential output signal of said switch arrangement (63) is selectively provided, via the switches $\Phi_1$, as the differential feedback signal to the input capacitors (C) of the SHA.

The cyclic D/A-converter 60 further comprises a clock signal generator (not shown) which generates a set of clock signals $\Phi_{out}$, $\Phi_s$, $\Phi_1$ and $\Phi_2$ of predetermined timing and predetermined signal values.

Figure 14:
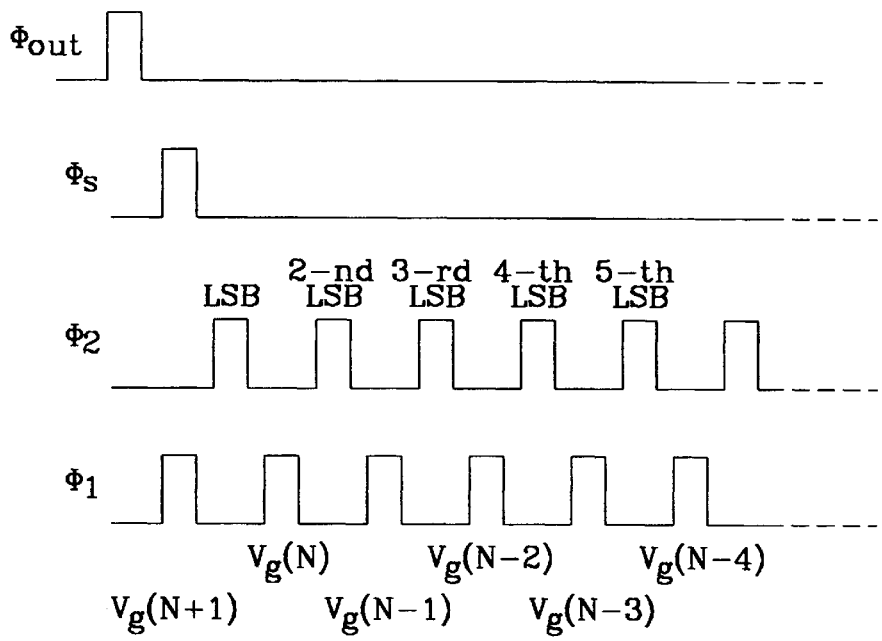
FIG. 14 is a timing diagram illustrating the clock signals that are utilized in the D/A-converter realization of FIG. 13.

FIG. 14 is a timing diagram illustrating the clock signals $\Phi_{out}$, $\Phi_s$, $\Phi_1$ and $\Phi_2$ that are utilized in the D/A-converter realization of FIG. 13. The operation of the cyclic D/A-converter 60 is controlled by these clock signals in that the clock signals control the output switches and the control switches. In the figures, a specific control switch is referred to by the reference character of its corresponding clock signal. In this realization example, a switch is turned on when the corresponding clock signal goes high, and turned of f when the corresponding clock signal goes low.

The operation of the cyclic D/A-converter 60 will now be briefly described. The D/A-conversion starts by resetting the capacitor C at the SHC input at clock phase $\Phi_s$, thus defining the initial analog signal $V_g(N+1)=0$. This analog signal (feedback signal) is sampled onto the input capacitors C of the SHA through the feedback switches $\Phi_1$. At this clock phase, the input capacitors C are grounded on one side, and at the same time, the first OPAMP 61 is resetted.

In the next clock phase $\Phi_2$, the subtraction of the reference $V_r$ and the amplification by 0.5 by the SHA are realized. The result is sampled by the SHC, and the LSB input bit determines whether or not the inversion is performed by the switch arrangement 63. Accordingly, the intermediate signal $V_g(N)$ is generated according to eq. (2.1).

During the next clock phase $\Phi_1$ (the digital input is still active), $V_g(N)$ is sampled onto the input capacitors C of the SHA through the $\Phi_1$-switches associated with the input capacitors C, and the first OPAMP 61 is resetted.

During the next clock phase $\Phi_2$, the subtraction of the reference $V_r$ and the amplification by 0.5 in the SHA are realized. In the same clock phase, the result is sampled by the SHC, and the signal inversion is selectively performed by the switch arrangement 63 in dependence on the 2-nd LSB. Accordingly, the intermediate signal $V_g(N-1)$ is generated according to eq. (2.1).

The operation continues according to eq. (2.1) until the MSB is inputted. The clock pulse $\Phi_{out}$ controls the output switches of the cyclic D/A-converter 60, and when $\Phi_{out}$ is high, the final analog output signal $V_{gout}=V_g(1)$ is extracted from the circuit. Preferably, the extraction of the final analog output signal is performed just prior to starting a new D/A-conversion, as indicated in FIG. 14, where $\Phi_{out}$ precedes the other clock signals.

In summary, it has been shown that the proposed Gray code D/A-converters are superior to conventional D/A-converters. The new and inventive D/A-converter architectures based on the Gray code-to-analog conversion algorithm according to the invention are well suited for high-accuracy as well as for low-distortion applications.

The embodiments described above are merely given as examples, and it should be understood that the invention is not limited thereto. It is of course possible to embody the invention in specific forms other than those described without departing from the spirit of the invention. Further modifications and improvements which retain the basic underlying principles disclosed and claimed herein are within the scope and spirit of the invention.

What is claimed:

1. A method for converting a digital input signal of a predetermined integer number, N, of bits b(i) into an analog output signal $V_{out}$ by using a predetermined reference signal $V_r$, where i is an integer such that $1 \leq i \leq N$, said method comprising the steps of:

providing the digital input signal in the form of Gray code; and generating the analog output signal according to a Gray code-to-analog algorithm defined by the following equations:

$$V_g(N+1) = 0;$$
$$V_g(i) = \frac{1}{2} \cdot [V_g(i+1) - V_r] \cdot (-1)^{b(i)}, i = N, N-1, \ldots, 1;$$
$$V_{out} = V_g(1),$$

wherein the Gray code bits of the digital input signal are successively applied one by one starting from the least significant bit b(N) and ending with the most significant bit b(1).

2. The method according to claim 1, wherein said providing step comprises the step of digitally converting a signal of regular binary code into said Gray coded digital input signal.

3. A method for converting a digital input signal of a predetermined integer number of bits into an analog output signal according to a recursive digital-to-analog conversion algorithm, said method comprising the steps of:

providing the digital input signal in the form of Gray code;

successively applying the Gray code bits of the digital input signal in the recursive steps of the conversion algorithm, one Gray code bit for each recursive step starting with the least significant bit b(N) and ending with the most significant bit b(1); and generating the analog output signal by defining and recursively updating an intermediate signal according to the conversion algorithm, wherein each recursive step of the conversion algorithm includes the steps of subjecting the intermediate signal to a subtraction of a predetermined reference signal, to an amplification and to a sample-and-hold operation, and selectively, in dependence on the Gray code bit applied in that recursive step, inverting the intermediate signal, and wherein the analog output signal is defined as the intermediate signal of the last recursive step.

4. The method according to claim 3, wherein said subtraction is performed prior to said selective inversion, and said amplification.

5. The method according to claim 3, wherein the recursive steps of the algorithm are timewisely separated from each other, as well as temporarily electrically isolated from each other.

6. A digital-to-analog (D/A) converter for converting a Gray code digital input signal of a predetermined integer number, N, of bits b(i) into an analog output signal $V_{out}$ by using a predetermined reference signal $V_r$, where i is an integer such that $1 \leq i \leq N$, said D/A-converter comprising:

means for generating the analog output signal according to a Gray code-to-analog algorithm defined by the following equations:

$$V_g(N+1) = 0;$$
$$V_g(i) = \frac{1}{2} \cdot [V_g(i+1) - V_r] \cdot (-1)^{b(i)}, i = N, N-1, \ldots, 1;$$

wherein the Gray code bits of the digital input signal are successively applied one by one starting from the least significant bit b(N) and ending with the most significant bit b(1).

7. The D/A-converter according to claim 6, further comprising means for digitally converting a signal of regular binary code into said Gray code digital input signal.

8. The D/A-converter according to claim 6, wherein said D/A-converter is a cyclic D/A-converter.

9. The D/A-converter according to claim 6, wherein said D/A-converter is a pipeline D/A-converter.

10. A cyclic digital-to-analog (D/A) converter responsive to a Gray code digital input signal of a predetermined number of input bits for generating an analog output signal, said cyclic D/A-converter comprising:

a digital input terminal for successively receiving the Gray code bits one by one starting from the least significant bit b(N) and ending with the most significant bit b(1);

means for generating the analog output signal by cyclically updating an intermediate signal, wherein said generating means includes means for subjecting the intermediate signal to a subtraction of a predetermined reference signal, to an amplification by 0.5 and to a sample-and-hold operation, and means for selectively, in dependence on the Gray code bit currently received by the digital input terminal, inverting the intermediate signal.

11. A cyclic digital-to-analog (D/A) converter responsive to a Gray code digital input signal of a predetermined number of input bits for generating an analog output signal by using a predetermined reference signal, said cyclic D/A-converter comprising:

a digital input terminal for successively receiving the Gray code input bits one by one starting from the least significant bit b(N) and ending with the most significant bit b(1);

a sample-and-hold amplifier for selectively sampling a ground signal and the predetermined reference signal, and for holding the ground signal and the reference signal, said sample-and hold amplifier having a gain factor of 0.5 in its hold mode; and a sample-and-hold circuit for recurrently sampling and holding the output signal of said sample-and-hold amplifier;

means, connected to said digital input terminal, for selectively, in dependence on the Gray code input bit currently received by the digital input terminal, inverting the sampled and held signal of said sample-and-hold circuit;

a feedback selectively connected from said inverting means to the sample-and-hold amplifier for feeding said selectively inverted signal to said sample-and-hold amplifier;

an output switch for extracting the selectively inverted signal as the analog output signal when all Gray code input bits have been received and processed; and a signal generator for generating clock signals that control said sample-and-hold amplifier, said sample-and-hold circuit and said output switch.

12. A cyclic digital-to-analog (D/A) converter for converting a Gray code digital input signal of a predetermined number of input bits into an analog output signal by using a predetermined differential reference signal, said cyclic D/A converter comprising:

a digital input terminal for successively receiving the Gray code input bits one by one starting from the least significant bit b(N) and ending with the most significant bit b(1);

a sample-and-hold amplifier with a gain factor of 0.5 in its hold mode, having a first operational amplifier with two input terminals and two output terminals, first capacitors each of which is selectively connected, via a respective switch, in parallel over a respective pair of input-output terminals of said first operational amplifier, and second capacitors, each of which is selectively connected, via a respective switch, in parallel over a respective pair of input-output terminals of said first operational amplifier, wherein the first capacitors are selectively connected via respective switches to ground, and the second capacitors are selectively connected, via respective switches, to the differential reference signal for being charged in response thereto, said sample-and-hold amplifier being in its hold mode when said first capacitors and said second capacitors are connected in parallel over said first operational amplifier;

a sample-and-hold circuit having a second operational amplifier with two input terminals and two output terminals, and associated front capacitors connected to the input terminals of said second operational amplifier, said front capacitors being selectively connected, via switches to the output terminals of said first operational amplifier for sampling the amplified differential output signal of said sample-and-hold amplifier, and switches connected in parallel over respective pairs of input-output terminals of said second operational amplifier for configuring, when closed, the sample-and-hold circuit into a hold mode; and a switch arrangement connected to said digital input terminal and to the output terminals of said second operational amplifier for selectively, depending on the Gray code input bit currently received by said digital input terminal, interchanging the differential signal held by said sample-and-hold circuit;

a feedback selectively connected, via respective feedback switches, from said switch arrangement to said first capacitors of said sample-and-hold-amplifier for feeding the selectively interchanged differential signal to said first capacitors so as to charge said first capacitors in response thereto;

switches connected in parallel over said first operational amplifier for selectively resetting it;

switches connected in parallel over said second operational amplifier for selectively resetting it;

output switches for extracting the selectively interchanged signal as the analog output signal when all Gray code input bits have been received and processed; and a clock signal generator for generating a set of clock signals of predetermined timing and signal valves, wherein said switches, said feedback switches and said output switches are controlled by said clock signals.

13. A pipeline digital-to-analog (D/A) converter responsive to a Gray code digital input signal of a predetermined number of input bits for generating an analog output signal, said pipeline D/A-converter having a number of stages connected in cascade, each stage being responsive to a respective one of the input bits and an analog input signal, said pipeline D/A-converter comprising means for providing a delay between successive Gray code input bits, wherein each stage includes means for generating an output signal of said stage in response to said respective Gray code input bit and said analog input signal, said generating means including means for selectively, in dependence on said respective Gray code input bit, inverting said analog input signal.

14. The pipeline D/A-converter according to claim 13, wherein said generating means further comprises means for subjecting said analog input signal to a subtraction of a predetermined reference signal, and to an amplification by 0.5.

15. A pipeline stage for a pipeline digital-to-analog (D/A) converter having a number of stages, said pipeline stage being responsive to the analog output signal of a preceding stage of said pipeline D/A-converter, to a predetermined reference signal, and to an input bit of a digital input signal, and comprising:

means for subjecting the analog output signal of the preceding stage to a subtraction of the predetermined reference signal, selectively, in response to said input bit, to a signal inversion, and to an amplification by 0.5 to generate an analog output signal of said pipeline stage.

16. A pipeline stage for a pipeline digital-to-analog (D/A) converter, said pipeline stage being responsive to an analog input signal, a predetermined reference signal and an input bit of a digital input signal, and comprising:

a sample-and-hold amplifier for selectively sampling the predetermined reference signal, and the analog input signal, and for holding the reference signal and the analog input signal, said sample-and-hold amplifier having a gain factor of 0.5 in its hold mode; and means for selectively, in dependence on said input bit, inverting the output signal of said sample-and-hold amplifier to generate an analog output signal of said pipeline stage.

17. The pipeline stage according to claim 16, further comprising:
an output switch connected to said inverting means for switching said analog output signal out of the stage; and
a signal generator for generating clock signals that control said sample-and-hold amplifier, and said output switch.

18. A pipeline stage for a pipeline digital-to-analog (D/A) converter, said pipeline stage being responsive to a differential analog input signal, a predetermined differential reference signal, and an input bit of a digital input signal, and comprising:
a sample-and-hold amplifier with a gain factor of 0.5 in its hold mode, having an operational amplifier with two input terminals and two output terminals, first capacitors each of which is selectively connected, via a respective switch, in parallel over a respective pair of input-output terminals of said operational amplifier, and second capacitors, each of which is selectively connected, via a respective switch, in parallel over a respective pair of input-output terminals of said operational amplifier, wherein the first capacitors are selectively connected via respective switches to the differential reference signal, and the second capacitors are selectively connected, via respective switches, to the differential analog input signal for being charged in response thereto, said sample-and-hold amplifier being in its hold mode when said first capacitors and said second capacitors are connected in parallel over said operational amplifier;
a switch arrangement connected to the output terminals of said operational amplifier for selectively, depending on the input bit to the stage, interchanging the differential signal held and amplified by said sample-and-hold amplifier;
switches connected in parallel over said operational amplifier for selectively resetting it;
output switches connected to said switch arrangement for extracting the selectively interchanged signal as an analog output signal of the stage; and
a clock signal generator for generating a set of clock signals of predetermined timing and signal values, wherein said switches and said output switches are controlled by said clock signals.

19. A cyclic digital-to-analog (D/A) converter responsive to a Gray code digital input signal of a predetermined number of input bits for generating an analog output signal by using a predetermined reference signal, said cyclic D/A-converter comprising:
a digital input terminal for successively receiving the Gray code input bits one by one starting from the least significant bit b(N) and ending with the most significant bit b(1);
a sample-and-hold amplifier for selectively sampling a feedback signal, initially being equal to zero, and the predetermined reference signal, and for holding said feedback signal and the reference signal, said sample-and-hold amplifier having a gain factor of 0.5 in its hold mode; and
a sample-and-hold circuit for recurrently sampling and holding the output signal of said sample-and-hold amplifier;
means, connected to said digital input terminal, for selectively, in dependence on the Gray code input bit currently received by the digital input terminal, inverting the sampled and held signal of said sample-and-hold circuit;
a feedback selectively connected from said inverting means to the sample-and-hold amplifier for providing said selectively inverted signal as said feedback signal to said sample-and-hold amplifier; and
an output switch for extracting the selectively inverted signal as the analog output signal when all Gray code input bits have been received and processed.

20. The, cyclic D/A-converter according to claim 19, further comprising a signal generator for generating clock signals that control said sample-and-hold amplifier, said sample-and-hold circuit and said output switch.

21. A cyclic digital-to-analog (D/A) converter for converting a Gray code digital input signal of a predetermined number of input bits into an analog output signal by using a predetermined reference signal, said cyclic D/A-converter comprising:
a digital input terminal for successively receiving the Gray code input bits one by one starting from the least significant bit b(N) and ending with the most significant bit b(1);
a sample-and-hold amplifier with a gain factor of 0.5, having a first operational amplifier with two input terminals and two output terminals, first capacitors each of which is connected in parallel over a respective pair of input-output terminals of said first operational amplifier, and second capacitors, each of which is selectively connected, via a respective switch, to a respective input terminal of said first operational amplifier, wherein the second capacitors are selectively responsive, via respective switches, to said reference signal, being differential, and, via respective feedback switches, to a differential feedback signal which initially is equal to zero, for being charged in response thereto;
switches connected in parallel over said first operational amplifier for selectively resetting it;
a sample-and-hold circuit having a second operational amplifier with two input terminals and two output terminals, connections between each pair of input-output terminals, and an associated capacitor connected over the input terminals of said second operational amplifier, said sample-and-hold circuit being selectively connected, via switches, to the output terminals of said first operational amplifier for sampling the amplified differential output signal of said sample-and-hold amplifier;
a switch arrangement connected to said digital input terminal and to the output terminals of said second operational amplifier for selectively, depending on the Gray code input bit currently received by said digital input terminal, interchanging the differential output signal of said sample-and-hold circuit, the selectively interchanged differential output signal of said switch arrangement being selectively provided, via said feedback switches, as said differential feedback signal to said second capacitors of said sample-and-hold amplifier;
output switches for extracting the selectively interchanged differential signal as the analog output signal when all Gray code input bits have been received and processed; and
a clock signal generator for generating a set of clock signals of predetermined timing and signal values, wherein said switches, feedback switches and output switches are controlled by said clock signals.

* * * * *

UNITED STATES PATENT AND TRADEMARK OFFICE
CERTIFICATE OF CORRECTION

PATENT NO. : 6,078,276
DATED : June 20, 2000
INVENTOR(S) : Svante Signell and Nianxiong Tan Page 1 of 1

It is certified that error appears in the above-identified patent and that said Letters Patent is hereby corrected as shown below:

<u>Column 28,</u>
Line 35, add: $V_{out} = V_g(1)$;

Signed and Sealed this

Eighteenth Day of September, 2001

*Attest:*

NICHOLAS P. GODICI
*Attesting Officer*  *Acting Director of the United States Patent and Trademark Office*